(12) United States Patent
Lee et al.

(10) Patent No.: US 11,379,997 B2
(45) Date of Patent: Jul. 5, 2022

(54) IMAGE DEVICES INCLUDING IMAGE SENSORS AND IMAGE SIGNAL PROCESSORS, AND OPERATION METHODS OF IMAGE SENSORS

(71) Applicant: Samsung Electronics Co., Ltd., Suwon-si (KR)

(72) Inventors: Hansol Lee, Seongnam-si (KR); Shusaku Ishikawa, Suwon-si (KR); Jeongguk Lee, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/992,792

(22) Filed: Aug. 13, 2020

(65) Prior Publication Data
US 2021/0133986 A1    May 6, 2021

(30) Foreign Application Priority Data
Nov. 1, 2019    (KR) .................. 10-2019-0138562

(51) Int. Cl.
*G06T 7/246*    (2017.01)
*G06T 7/00*    (2017.01)
(Continued)

(52) U.S. Cl.
CPC .............. *G06T 7/248* (2017.01); *G06T 5/002* (2013.01); *G06T 5/005* (2013.01); *G06T 5/30* (2013.01);
(Continued)

(58) Field of Classification Search
CPC ......... G06T 7/248; G06T 7/0002; G06T 7/90; G06T 7/97; G06T 7/11; G06T 7/74; G06T 5/002; G06T 5/005; G06T 5/30; G06T 5/50; G06T 5/008; G06T 5/003; G06T 2207/10024; G06T 2207/20208; G06T 2207/10144; G06T 2207/10016; G06T 2207/20221; H04N 9/646; H04N 9/735; H04N 9/04; H04N 9/04551; H04N 9/0451;
(Continued)

(56) References Cited

U.S. PATENT DOCUMENTS 8,379,094 B2    2/2013 Oh et al.
8,508,619 B2    8/2013 Oh et al.
(Continued)

FOREIGN PATENT DOCUMENTS

JP    2012-084983 A    4/2012
JP    5682434 B2    3/2015
(Continued)

*Primary Examiner* — Jose L Couso
(74) *Attorney, Agent, or Firm* — Harness, Dickey & Pierce, P.L.C.

(57) ABSTRACT

An operation method of an image sensor includes detecting a motion region based on a first image and a second image to obtain a detected motion region, the first image corresponding to a first exposure time and the second image corresponding to a second exposure time, the second exposure time being shorter than the first exposure time, determining a weight for the detected motion region, performing signal pre-processing on the first image to generate a pre-processed image, and outputting a third image based on the pre-processed image and the weight.

20 Claims, 23 Drawing Sheets
(5 of 23 Drawing Sheet(s) Filed in Color)

(51) Int. Cl.
*G06T 5/00* (2006.01)
*H04N 9/64* (2006.01)
*H04N 9/73* (2006.01)
*H04N 5/235* (2006.01)
*H03M 1/12* (2006.01)
*G06T 5/30* (2006.01)

(52) U.S. Cl.
CPC ............ *G06T 7/0002* (2013.01); *H03M 1/12* (2013.01); *H04N 5/2351* (2013.01); *H04N 9/646* (2013.01); *H04N 9/735* (2013.01); *G06T 2207/10024* (2013.01)

(58) Field of Classification Search
CPC .... H04N 9/73; H04N 5/2351; H04N 5/23254; H04N 5/3535; H04N 5/359; H04N 5/35581; H04N 5/2355; H04N 5/353; H04N 5/23232; H04N 5/23258; H04N 5/23277; H04N 5/2353; H04N 5/232; H04N 5/23229; H04N 5/265; H04N 5/2628; H04N 5/213; H04N 5/23267; H04N 5/2356; H04N 5/35554; H04N 5/235; H04N 5/23248; H04N 5/23261; H04N 1/46; H04N 1/644; H03M 1/12; G06K 9/00234; G06K 9/4652; G06K 9/4671; G06K 9/6288; G06K 9/6289; G06K 9/629; G06V 40/162; G06V 10/56; G06V 10/462; G06V 10/88; G06V 10/803; G06V 10/806; G06V 10/72; G06V 30/1918

See application file for complete search history.

(56) References Cited

U.S. PATENT DOCUMENTS

| | | | |
|---|---|---|---|
| 8,854,489 B2 | 10/2014 | Jang et al. | |
| 9,451,173 B2 | 9/2016 | Kang et al. | |
| 9,509,918 B2 | 11/2016 | Liu et al. | |
| 9,648,251 B2 | 5/2017 | Pouli et al. | |
| 9,819,873 B2* | 11/2017 | Shikata | H04N 5/2353 |
| 11,190,703 B2* | 11/2021 | Katsumata | H04N 5/2353 |
| 11,196,918 B2* | 12/2021 | Douady | H04N 5/247 |
| 2006/0238621 A1* | 10/2006 | Okubo | H04N 5/23254 348/208.99 |
| 2007/0237514 A1* | 10/2007 | Pillman | H04N 5/232121 396/153 |
| 2012/0262600 A1* | 10/2012 | Velarde | H04N 9/735 348/223.1 |
| 2016/0142645 A1* | 5/2016 | Shionoya | H04N 5/265 348/218.1 |
| 2016/0373653 A1 | 12/2016 | Park et al. | |
| 2017/0019612 A1* | 1/2017 | Kino | H04N 5/23254 |
| 2017/0359536 A1* | 12/2017 | Lee | H04N 5/3577 |
| 2020/0059599 A1* | 2/2020 | Hisamoto | H04N 5/23238 |
| 2020/0267339 A1* | 8/2020 | Douady-Pleven | G06T 3/0093 |
| 2021/0344829 A1* | 11/2021 | Bessou | H04N 5/2625 |

FOREIGN PATENT DOCUMENTS

| | | |
|---|---|---|
| JP | 6148497 B2 | 6/2017 |
| JP | 6184290 B2 | 8/2017 |
| KR | 10-2015-0099302 A | 8/2015 |

* cited by examiner

IMAGE DEVICES INCLUDING IMAGE SENSORS AND IMAGE SIGNAL PROCESSORS, AND OPERATION METHODS OF IMAGE SENSORS

CROSS-REFERENCE TO RELATED APPLICATIONS

This application claims priority under 35 U.S.C. § 119 to Korean Patent Application No. 10-2019-0138562 filed on Nov. 1, 2019, in the Korean Intellectual Property Office, the disclosures of which are incorporated by reference herein in their entireties.

BACKGROUND

Some example embodiments described herein relate to an image device, and more particularly, relate to an image device including an image sensor and an image signal processor, and an operation method of the image sensor.

An image sensor included in a smartphone, a tablet personal computer (PC), or a digital camera obtains image information about an external object by converting a light reflected from the external object into an electrical signal. Various image signal processing operations are performed to convert an electrical signal obtained from the image sensor into image information actually perceivable by a person or to improve the quality of the image information.

For example, to provide a high-quality image to a user, the image device may make a dynamic range of an image better. The dynamic range means a range capable of expressing relatively wide luminance from a dark portion to a bright portion in an image. An image, the dynamic range of which is improved, is called a "high dynamic range (HDR) image". The image device may generate the HDR image by obtaining and combining images corresponding to different exposure times. However, various issues such as a color artifact may occur in combining images corresponding to different exposure times.

SUMMARY

Some example embodiments provide an image device including an image sensor and an image signal processor capable of preventing or reducing color degradation in motion compensation according to a longer compensation scheme, and an operation method of the image sensor.

According to some example embodiments, an operation method of an image sensor includes detecting a motion region based on a first image and a second image to obtain a detected motion region, the first image corresponding to a first exposure time and the second image corresponding to a second exposure time, the second exposure time being shorter than the first exposure time, determining a weight for the detected motion region, performing signal pre-processing on the first image to generate a pre-processed image, and outputting a third image based on the pre-processed image and the weight.

According to some example embodiments, an image device includes an image sensor including a plurality of pixels configured to output first analog signals and second analog signals, the first analog signals corresponding to a first exposure time and the second analog signals corresponding to a second exposure time, the second exposure time being shorter than the first exposure time, an analog-to-digital converter configured to convert the first analog signals and the second analog signals to obtain digital signals including a first image and a second image, and first processing circuitry configured to receive information about a white balance gain from an image signal processor, generate a pre-processed image by performing pre-processing on the first image based on the information about the white balance gain, and generate a third image by performing motion compensation based on the pre-processed image, and the image signal processor including second processing circuitry, the second processing circuitry being configured to perform white balancing on the third image from the image sensor based on the white balance gain to obtain a white balanced image.

According to some example embodiments, an operation method of an image sensor includes detecting a motion region based on a first image and a second image to obtain a detected motion region, the first image corresponding to a first exposure time and the second image corresponding to a second exposure time, the second exposure time being shorter than the first exposure time, determining a weight for the detected motion region, generating a pre-processed image by obtaining information about a white balance gain from an external image signal processor, and performing signal pre-processing on the first image based on the information about the white balance gain, and outputting a third image based on the pre-processed image and the weight.

BRIEF DESCRIPTION OF THE FIGURES

The patent or application file contains at least one drawing executed in color. Copies of this patent or patent application publication with color drawing(s) will be provided by the Office upon request and payment of the necessary fee.

The above and other objects and features will become apparent by describing in detail some example embodiments thereof with reference to the accompanying drawings.

DETAILED DESCRIPTION

Below, some example embodiments may be described in detail and clearly to such an extent that one of ordinary skill in the art easily implements some example embodiments. In the description below, the terms "block", "unit", "module", etc. or components corresponding to the terms may be implemented using processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. For example, the terms "block", "unit", "module", etc. or components corresponding to the terms may be implemented in the form of software, hardware, or a combination thereof.

Figure 1:
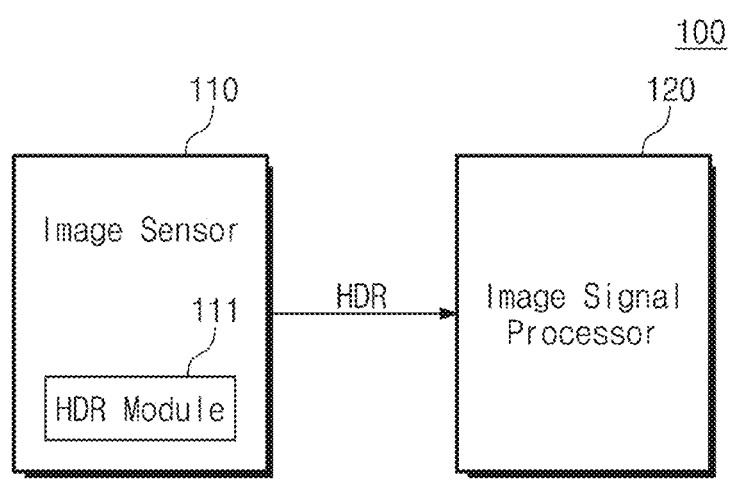
FIG. 1 is a block diagram illustrating an image device according to some example embodiments.

FIG. 1 is a block diagram illustrating an image device according to some example embodiments. Referring to FIG. 1, an image device 100 may include an image sensor 110 and/or an image signal processor 120. The image device 100 may be included in various computing systems such as a desktop computer, a laptop computer, a tablet computer, a smartphone, a wearable device, a black box, and/or a digital camera.

The image sensor 110 may output image data based on light incident from the outside (e.g., outside the image sensor 110 and/or the image device 100). For example, the image sensor 110 may include a plurality of pixels. Each of the plurality of pixels may be configured to output an electrical signal corresponding to the light incident from the outside. The image sensor 110 may output image data based on the electrical signal. In some example embodiments, the image data output from the image sensor 110 may include, but is not limited to, brightness information and/or color information of a particular frame.

The image signal processor 120 may receive the image data from the image sensor 110 and may perform various signal processing operations on the received image data. For example, the image signal processor 120 may perform the following signal processing on the received image data: noise cancellation, white balancing, gamma correction, color correction, color transformation, etc. The signal-processed image data may be transferred to an external device (e.g., a display device and/or an application processor) or may be stored in a separate storage device and/or memory device.

In some example embodiments, the image sensor 110 may output a high-quality image (e.g., high dynamic range (HDR)). The high-quality image HDR may indicate image data of a high quality implemented by combining different image data so as to have a high dynamic range. For example, the image sensor 110 may include an HDR module 111 configured to generate the high-quality image HDR. The HDR module 111 may generate the high-quality image in which improved dynamic range is implemented, by combining at least two image data having different exposure times. According to some example embodiments, operations described herein as being performed by the image device 100, the image sensor 110 (e.g., outputting brightness information and/or color information of a particular frame), the HDR module and/or an image signal processor 120 may be performed by processing circuitry.

In some example embodiments, the HDR module 111 may generate the high-quality image HDR based on long exposure image data. A structure and an operation method of the HDR module 111 according to some example embodiments will be described with reference to drawings below.

Figure 2:
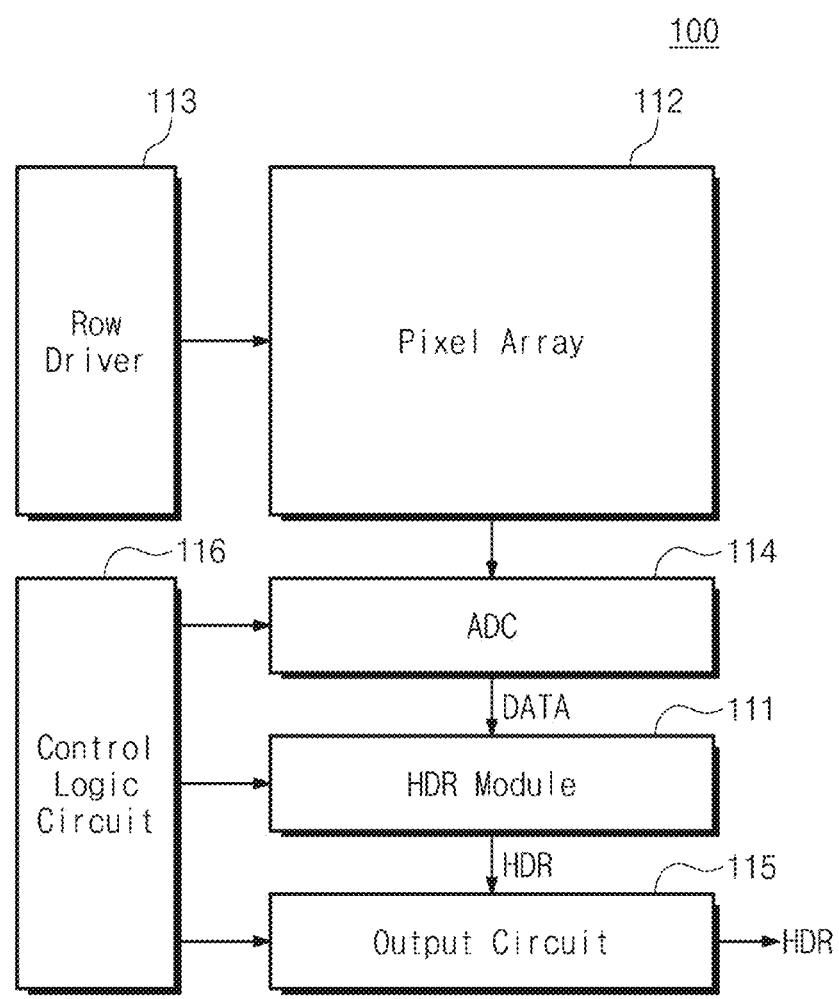
FIG. 2 is a block diagram illustrating an image sensor of FIG. 1.

FIG. 2 is a block diagram illustrating an image sensor of FIG. 1. Referring to FIGS. 1 and 2, the image sensor 110 may include the HDR module 111, a pixel array 112, a row driver 113, an analog-to-digital converter 114, an output circuit 115, and/or a control logic circuit 116. According to some example embodiments, operations described herein as being performed by the row driver 113, the analog-to-digital converter 114, the output circuit 115 and/or the control logic circuit 116 may be performed by processing circuitry.

The pixel array 112 may include a plurality of pixels. Each of the plurality of pixels may be configured to output an analog signal, that is, an electrical signal, which is proportional to the magnitude of light incident from the outside, based on the incident light. In some example embodiments, the plurality of pixels may be combined with different color filters (e.g., R, G, and B color filters) for receiving lights of different wavelengths. In some example embodiments, the color filters combined with the plurality of pixels may form a color filter array (CFA). The color filter array may be formed based on at least one of various patterns such as a Bayer pattern and/or a tetra pattern.

The row driver 113 may be configured to control the plurality of pixels included in the pixel array 112. For example, the row driver 113 may generate various control signals (e.g., a shutter signal, a transfer signal, a reset signal, and/or a selection signal) for controlling the plurality of pixels. In some example embodiments, the row driver 113 may control the plurality of pixels in units of a row, but some example embodiments are not limited thereto.

The ADC 114 may convert an analog signal formed from each of the plurality of pixels into a digital signal and may output the converted digital signal as data "DATA". In some example embodiments, the ADC 114 may generate the data "DATA" based on correlated double sampling (CDS). Although not illustrated in drawings, the image sensor 110 may further include a storage circuit and/or a memory configured to store the data "DATA" output from the ADC 114, and/or a ramp signal generator configured to generate a ramp signal to be used for an operation of the ADC 114.

The HDR module 111 may generate the high-quality image HDR based on the data "DATA" provided from the ADC 114. For example, the HDR module 111 may divide the data "DATA" into a plurality of images. The plurality of images may be (e.g., include) image data having different exposure times. The HDR module 111 may output the high-quality image HDR by combining the plurality of images.

The output circuit 115 may transfer the high-quality image HDR output from the HDR module 111 to an external device (e.g., a display and/or a storage device). The control logic circuit 116 may be configured to control various components in the image sensor 110 under control of an external control device (e.g., an image sensor device controller).

Figure 3A:
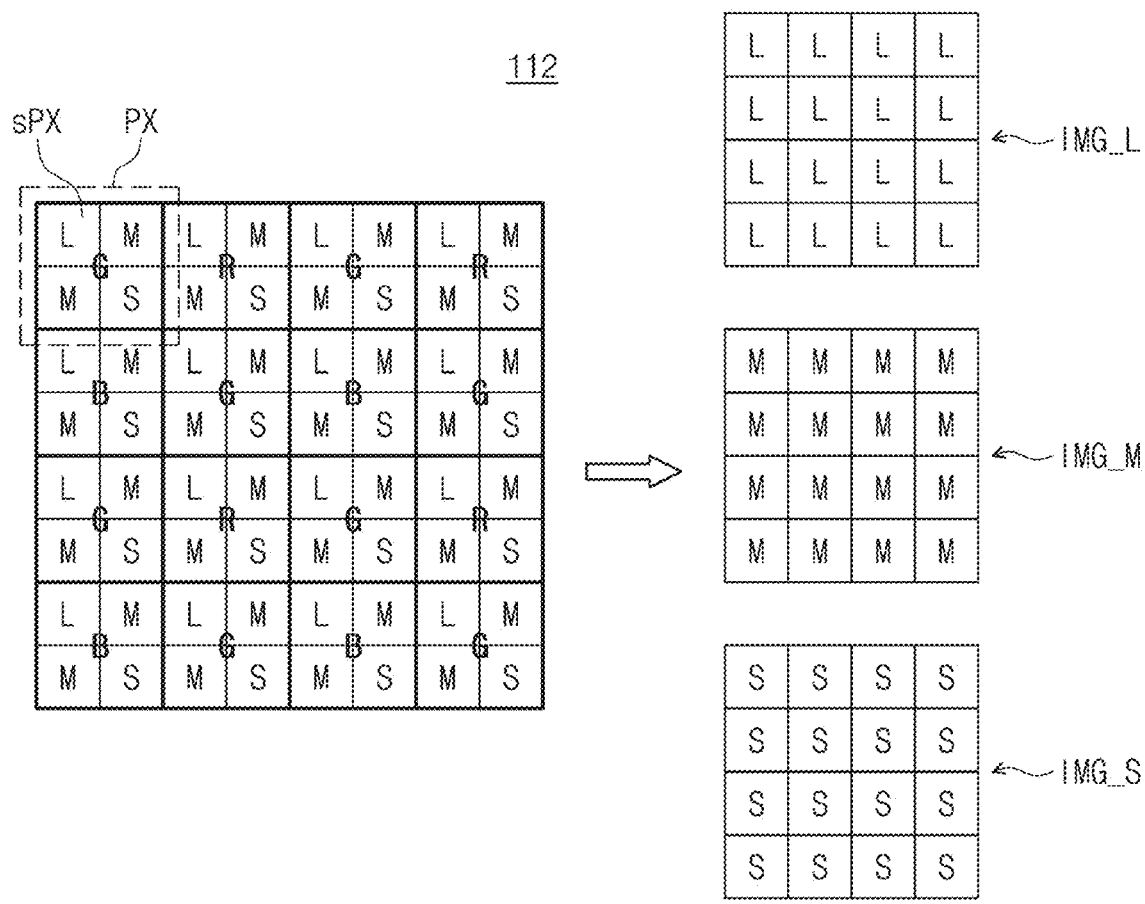
FIGS. 3A and 3B are diagrams for describing a plurality of pixels of an image sensor of FIG. 2.
Figure 3B:
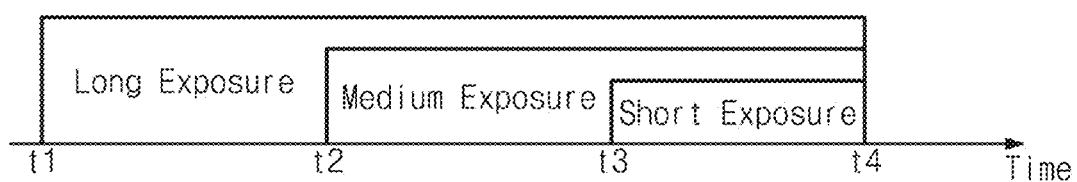

FIGS. 3A and 3B are diagrams for describing a plurality of pixels of an image sensor of FIG. 2. Referring to FIGS. 2 to 3B, the pixel array 112 of the image sensor 110 may include a plurality of pixels PX. The plurality of pixels PX may be arranged in a row direction and a column direction. Each of the plurality of pixels PX may correspond to one of color filters "R", "G", and "B" so as to receive a light of a particular wavelength. That is, pixels PX corresponding to a first color filter (e.g., "G") may receive a light of a green color, pixels PX corresponding to a second color filter (e.g., "R") may receive a light of a red color, and pixels PX corresponding to a third color filter (e.g., "B") may receive a light of a blue color. Kinds and arrangement of the color filters are examples, and some example embodiments are not limited thereto.

Each of the plurality of pixels PX may include a plurality of sub-pixels sPX. Each of the plurality of sub-pixels sPX may be configured to output an electrical signal corresponding to the incident light under control of the row driver 113. In this case, different exposure times may be applied to the plurality of sub-pixels sPX, respectively. For example, a long-exposure may be applied to some of the plurality of sub-pixels sPX, a medium-exposure may be applied to some of the remaining sub-pixels of the plurality of sub-pixels sPX, and a short-exposure may be applied to sub-pixels sPX, to which the long-exposure and the medium-exposure are not applied, from among the plurality of sub-pixels sPX.

In detail, one pixel PX may include four sub-pixels sPX. In this case, the long-exposure may be applied to one sub-pixel (e.g., "L"), the medium-exposure may be applied to two sub-pixels (e.g., "M"), and the short-exposure may be applied to one sub-pixel (e.g., "S"), to which the long-exposure and the medium-exposure are not applied, from among the four sub-pixels sPX.

As illustrated in FIG. 3B, the long-exposure may mean that there is generated an electrical signal corresponding to a first light received during a time from a first time point t1 to a fourth time point t4, the medium-exposure may mean that there is generated an electrical signal corresponding to a second light received during a time from a second time point t2 to the fourth time point t4, and the short-exposure may mean that there is generated an electrical signal corresponding to a third light received during a time from a third time point t3 to the fourth time point t4.

That is, in the same or a similar low-luminance environment, the magnitude of an electrical signal output from the sub-pixel "L" to which the long-exposure is applied may be greater than the magnitude of an electrical signal output from the sub-pixel "M" or "S" to which the medium-exposure or the short-exposure is applied. Alternatively, in the same or a similar high-luminance environment, the magnitude of an electrical signal output from the sub-pixel "S" to which the short-exposure is applied may be a magnitude corresponding to the incident light, but the magnitude of an electrical signal output from the sub-pixel "L" to which the long-exposure is applied may be in a saturation state regardless of the incident light.

As described above, different images (e.g., IMG_L, IMG_M, and IMG_S) to which different exposure times are applied may be obtained or extracted by making exposure times of the plurality of sub-pixels sPX different.

For convenience of description and for brevity of illustration, examples given in the description refer to the pixels PX being arranged in a 4×4 matrix and one pixel PX including 2×2 sub-pixels sPX, but some example embodiments are not limited thereto. For example, the pixel array 112 may further include a plurality of pixels, and one pixel may further include a plurality of sub-pixels.

For convenience of description and for brevity of illustration, examples given in the description refer to the long-exposure, the medium-exposure, and the short-exposure being applied to the plurality of sub-pixels sPX included in one pixel PX, but some example embodiments are not limited thereto. For example, exposure times of the plurality of sub-pixels sPX may be variously changed.

Figure 4A:
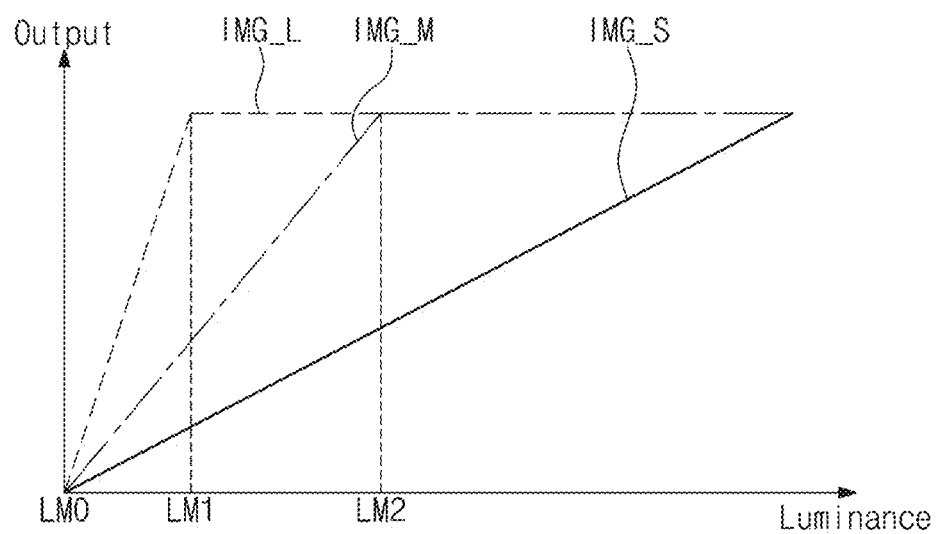
FIGS. 4A and 4B are graphs for describing a high-quality image generated based on images of FIGS. 3A and 3B.
Figure 4B:
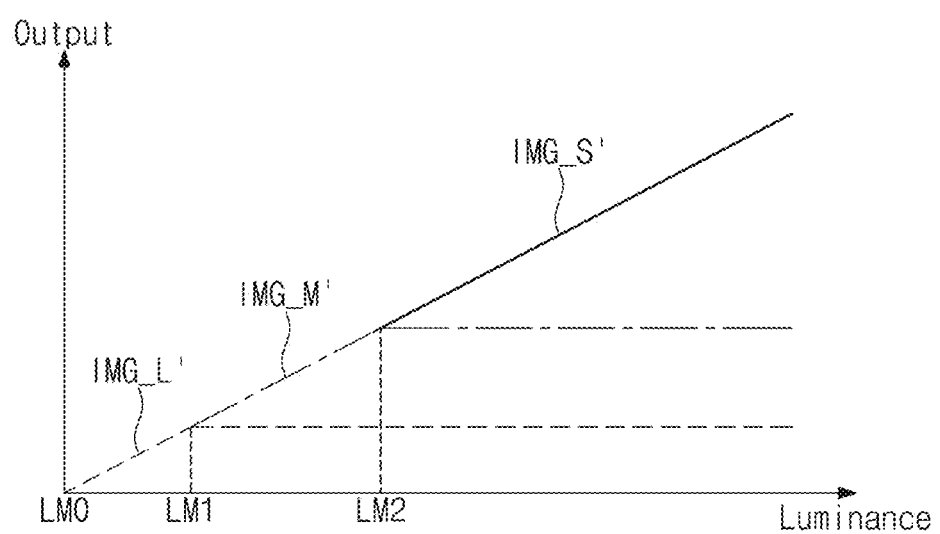

FIGS. 4A and 4B are graphs for describing a high-quality image generated based on images of FIGS. 3A and 3B. In the graphs of FIGS. 4A and 4B, a horizontal axis represents luminance of an external light, and a vertical axis represents an output magnitude of an image. Below, for convenience of description, data extracted from sub-pixels (e.g., "L") to which the long-exposure is applied or a set of this data is called a "long-exposure image IMG_L", data extracted from sub-pixels (e.g., "M") to which the medium-exposure is applied or a set of this data is called a "medium-exposure image IMG_M", and data extracted from sub-pixels (e.g., "S") to which the short-exposure is applied or a set of this data is called a "short-exposure image IMG_S".

For convenience of description, the term "magnitude of an image" may indicate pixel values, pixel codes, and/or data values included in an image.

Referring to FIGS. 2, 3A, 4A, and 4B, as the luminance of the external light increases, the magnitude of each of the long-exposure image IMG_L, the medium-exposure image IMG_M, and the short-exposure image IMG_S may increase. In this case, the magnitude of the long-exposure image IMG_L may increase linearly in a period between a 0-th luminance LM0 and a first luminance LM1 but may be saturated to a particular value in a period exceeding the first luminance LM1. The magnitude of the medium-exposure image IMG_M may increase linearly in a period between the 0-th luminance LM0 and a second luminance LM2 but may be saturated to a particular value in a period exceeding the second luminance LM2. The magnitude of the short-exposure image IMG_S may increase linearly in the total luminance period.

As illustrated in FIG. 4A, in a low-luminance period (e.g., LM0 to LM1), the short-exposure image IMG_S and the medium-exposure image IMG_M have a relatively small magnitude, and the long-exposure image IMG_L has a relatively great magnitude. This may mean that in the low-luminance period (e.g., LM0 to LM1), the long-exposure image IMG_L includes more accurate image information compared with the short-exposure image IMG_S and the medium-exposure image IMG_M.

For example, in the low-luminance period (e.g., LM0 to LM1), because the short-exposure image IMG_S and the medium-exposure image IMG_M have a relatively small magnitude, images obtained from the short-exposure image IMG_S and the medium-exposure image IMG_M may be a relatively dark images. In contrast, in the low-luminance period (e.g., LM0 to LM1), because the long-exposure image IMG_L has a relatively great magnitude, an image obtained from the long-exposure image IMG_L may be a relatively bright image. That is, in the low-luminance period (e.g., LM0 to LM1), an image that is more accurate, or relatively bright, or has an improved quality may be obtained through the long-exposure image IMG_L.

In a medium-luminance period (e.g., LM1 to LM2), the short-exposure image IMG_S has a relatively small magnitude, the medium-exposure image IMG_M has a relatively great magnitude, and the long-exposure image IMG_L may be in a saturated state. This may mean that in the medium-luminance period LM1 to LM2, the medium-exposure image IMG_M includes more accurate image information compared with the short-exposure image IMG_S and the long-exposure image IMG_L.

For example, in the medium-luminance period LM1 to LM2, because the long-exposure image IMG_L is in a saturated state, the long-exposure image IMG_L may not include image information. Accordingly, in the medium-luminance period LM1 to LM2, a more accurate image may be obtained through the medium-exposure image IMG_M.

In a high-luminance period (e.g., a period in which luminance is greater than LM2), the medium-exposure image IMG_M and the long-exposure image IMG_L may be in a saturated state. Accordingly, in the high-luminance period, a more accurate image may be obtained through the short-exposure image IMG_S.

As described above, with regard to a particular luminance region, the high-quality image HDR may be obtained by obtaining and combining more accurate images by using data (e.g., unsaturated data) having a relatively great magnitude.

In some example embodiments, as illustrated in FIG. 4A, because respective magnitudes of the data IMG_L, IMG_M, and IMG_S are different, in each period, normalization may be performed to combine the data IMG_L, IMG_M, and IMG_S.

FIG. 4B illustrates magnitudes of normalized images. In some example embodiments, the normalization may indicate a calculation procedure that allows data magnitudes corresponding to images, to which different exposures are applied, to be uniform or similar based on a normalization factor. An image of the low-luminance period LM0 to LM1 may be obtained by using a normalized long-exposure image IMG_L', an image of the medium-luminance period LM1 to LM2 may be obtained by using a normalized medium-exposure image IMG_M', and an image of the high-luminance period in which luminance is greater than LM2 may be obtained by using a normalized short-exposure image IMG_S'. An image (e.g., HDR data) that is accurate in the total luminance period may be obtained by combining the obtained images.

In some example embodiments, at a point where a luminance period is changed, a difference of data may occur after a normalization procedure. A motion of an image may be detected based on the difference of data. For example, at a point of the first luminance LM1, the magnitude of the normalized long-exposure image IMG_L' and the magnitude of the normalized medium-exposure image IMG_M' may be different. The occurrence of the motion may be detected based on the difference of magnitude with respect to a region corresponding to the first luminance LM1. In general, separate image processing such as motion compensation may be performed with respect to a region (below referred to as a "motion region") where the motion occurs.

In some example embodiments, a motion compensation scheme may include a shorter compensation scheme and a longer compensation scheme. The shorter compensation scheme may indicate a scheme to compensate for a motion based on data (e.g., a short-exposure image) having a relatively short exposure in the region where the motion occurs, and the longer compensation scheme may indicate a scheme to compensate for a motion based on data (e.g., a long-exposure image) having a relatively long exposure in the region where the motion occurs.

Because the shorter compensation scheme is based on a short-exposure image having a short exposure time, the degree of drag is small in the region where the motion occurs, but a signal to noise ratio (SNR) is relatively low. In contrast, because the longer compensation scheme is based on a long-exposure image having a long exposure time, the degree of drag is relatively great, but a signal to noise ratio (SNR) is relatively high. However, in the case of the longer compensation scheme, a color artifact may occur in the motion region under a particular condition (e.g., when all color channels are saturated).

The image sensor 110 according to some example embodiments may perform motion compensation on the high-quality image HDR based on the longer compensation scheme. In this case, the image sensor 110 according to some example embodiments may perform signal pre-processing on a long-exposure image, thus preventing or reducing a color artifact occurring after various signal processing operations are performed later at the image signal processor (ISP) 120.

Figure 5A:
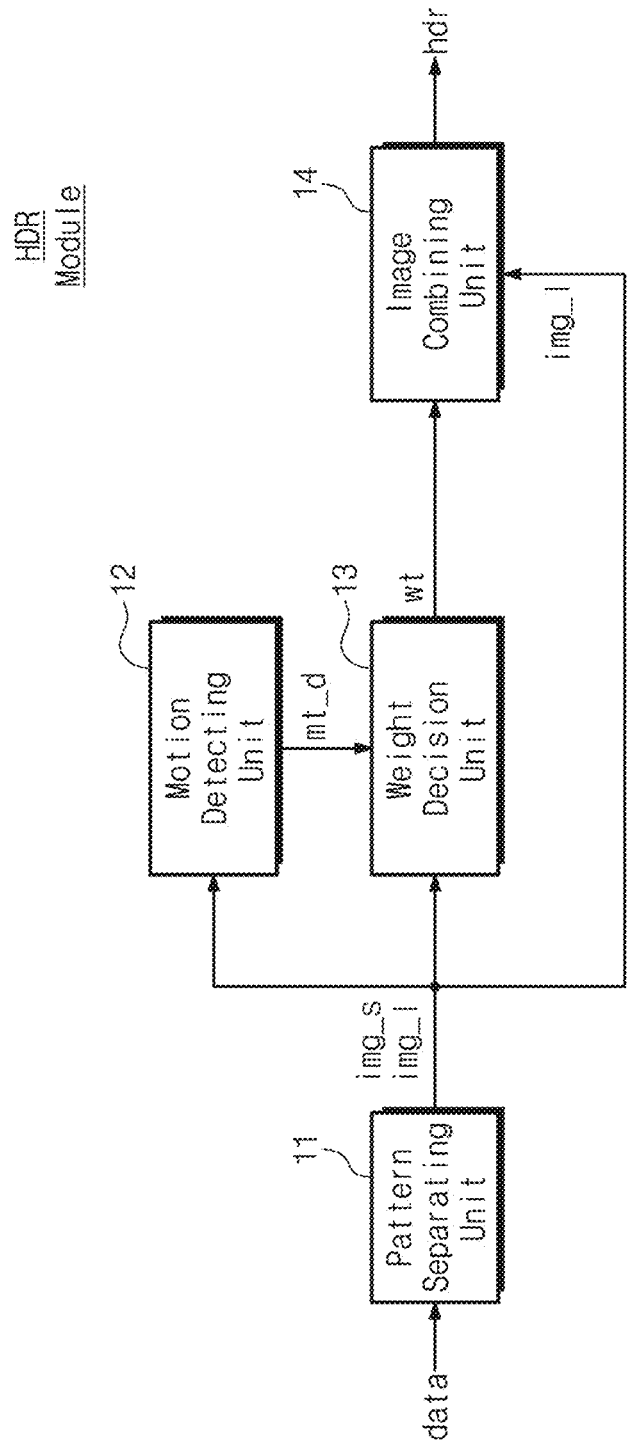
FIGS. 5A and 5B are diagrams for describing motion compensation of a longer compensation scheme.
Figure 5B:
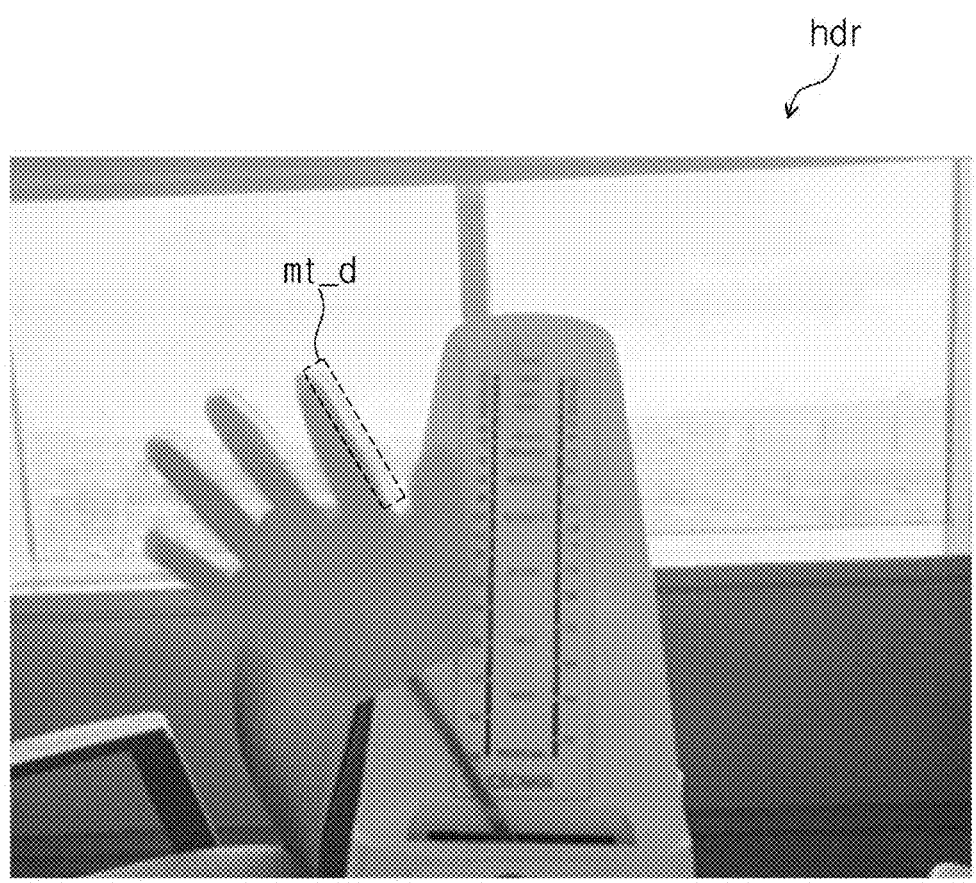

FIGS. 5A and 5B are diagrams for describing motion compensation of a longer compensation scheme. Motion compensation according to a conventional longer compensation scheme is described with reference to FIGS. 5A and 5B. Referring to FIGS. 5A and 5B, an HDR module may include a pattern separating unit 11, a motion detecting unit 12, a weight decision unit 13, and an image combining unit 14. The pattern separating unit 11 may separate data from a pixel array of an image sensor into a short-exposure image img_s and a long-exposure image img_1.

The motion detecting unit 12 may detect a motion based on the short-exposure image img_s and the long-exposure image img_1. For example, as described above, at particular luminance, magnitudes of the short-exposure image img_s and the long-exposure image img_1 may be different. In this case, the motion detecting unit 12 may decide a region where the magnitudes of the short-exposure image img_s and the long-exposure image img_1 are different, as a region (e.g., a motion region) in which a motion is present.

The weight decision unit 13 may decide a weight wt to be applied to the detected motion region mt_d based on the motion region mt_d detected by the motion detecting unit 12 and may output the decided weight wt. The image combining unit 14 may apply the weight wt decided by the weight decision unit 13 to the long-exposure image img_1 and may output a motion-compensated high-quality image hdr.

The conventional HDR module that performs the motion compensation based on the longer compensation scheme may generate the high-quality image hdr by applying the weight wt to the long-exposure image img_1 itself without separate signal processing for the long-exposure image img_1. In this case, a color artifact may occur in a motion region due to a later performed signal processing operation (e.g., white balancing) of an image signal processor (ISP).

For example, an image illustrated in FIG. 5B is an image to which the white balancing for the high-quality image hdr generated by the conventional HDR module is applied. As illustrated in the image of FIG. 5B, a color artifact of a red color may appear in the motion region mt_d. The color artifact occurs because, in the case where the motion is compensated for by the longer compensation scheme with the long-exposure image img_1 saturated, a value of a red channel becomes greater than a value of another channel through a white balancing operation later.

As a detailed example, Table 1 below shows a size (or a maximum, highest and/or upper limit value) of each channel before and after applying the white balancing on an image generated by the conventional HDR module performing the motion compensation depending on the longer compensation scheme.

TABLE 1

|  | Before White Balancing | After White Balancing |
|---|---|---|
| Red Channel | 1468 | 2304 |
| Green Channel | 1468 | 1468 |
| Blue Channel | 1468 | 1688 |

In the example of Table 1, data of each channel is expressed by 12 bits, a brightness ratio of the long-exposure image img_1 and the short-exposure image img_s is "2.79: 1", and a white balance (WB) gain satisfies "R:G:B=1.57: 1:1.16". In this case, a maximum value (or highest and/or upper limit value) after normalization is performed on a long-exposure image depending on the brightness ratio of the long-exposure image img_1 and the short-exposure image img_s is "1468" (≈4096/2.79), but a maximum value (or highest and/or upper limit value) of a red channel is "2304" after the white balance WB is applied. That is, as the maximum value (or highest and/or upper limit value) of the red channel becomes greater than maximum values (or highest and/or upper limit values) of other channels (e.g., a green channel and a blue channel), a color artifact of a red color occurs. This color artifact causes a decrease in the total quality of a final image.

Figure 6:
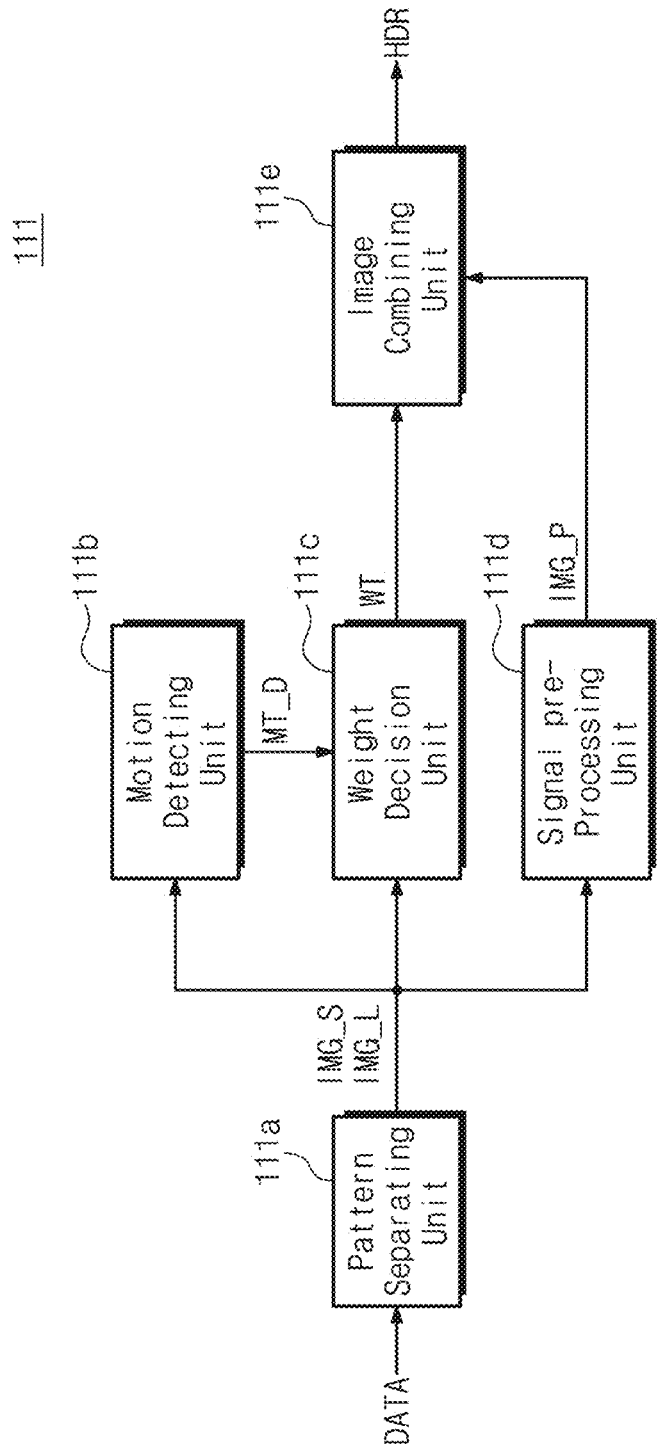
FIG. 6 is a block diagram illustrating an HDR module according to some example embodiments.

FIG. 6 is a block diagram illustrating an HDR module according to some example embodiments. Below, for convenience of description, it is assumed that image data obtained from the pixel array 112 includes a long-exposure image and a short-exposure image. However, some example embodiments are not limited thereto. For example, a long-exposure image and a short-exposure image to be described below may be understood as a long-exposure image and a medium-exposure image, or a medium-exposure image and a short-exposure image, depending on luminance corresponding to a region in which the motion is detected. That is, below, the terms "long-exposure image" and "short-exposure image" may be used to indicate a relative meaning with regard to an exposure times of the images and may be understood as being distinguished from a long-exposure, a medium-exposure, and/or a short-exposure described with reference to FIG. 3A.

Below, to describe some example embodiments clearly, the motion compensation of the HDR module 111 is mainly described. However, some example embodiments are not limited thereto. For example, the HDR module 111 may perform various image processing operations for other image aggregation and/or registration as well as the motion compensation, or may further include other functional blocks for various image processing operations.

Referring to FIGS. 1, 2, and 6, the HDR module 111 may include a pattern separating unit 111a, a motion detecting unit 111b, a weight decision unit 111c, a signal pre-processing unit 111d, and/or an image combining unit 111e. According to some example embodiments, operations described herein as being performed by the pattern separating unit 111a, the motion detecting unit 11b, the weight decision unit 111c, the signal pre-processing unit 111d, and/or the image combining unit 111e may be performed by processing circuitry.

The pattern separating unit 111a may separate the short-exposure image IMG_S and the long-exposure image IMG_L based on the data "DATA" from the ADC 114. For example, as described with reference to FIG. 3A, electrical signals output from the pixel array 112 may be converted into a digital signal by the ADC 114, and the converted digital signal may be output as the data "DATA". In this case, the pattern separating unit 111a may extract data corresponding to sub-pixels sPX to which the long-exposure is applied from the data "DATA" and may generate the long-exposure image IMG_L based on the extracted data. Likewise, the pattern separating unit 111a may extract data corresponding to sub-pixels sPX to which the short-exposure is applied from the data "DATA" and may generate the short-exposure image IMG_S based on the extracted data.

Although not illustrated in drawings, the long-exposure image IMG_L and the short-exposure image IMG_S generated by the pattern separating unit 111a may be normalized. That is, the long-exposure image IMG_L and the short-exposure image IMG_S that are used at following blocks (e.g., in other operations) may be normalized data.

The motion detecting unit 111b may detect a motion region MT_D based on the short-exposure image IMG_S and the long-exposure image IMG_L. For example, the motion detecting unit 111b may detect that the motion occurs in a region (e.g., a motion region) where a magnitude difference of the short-exposure image IMG_S and the long-exposure image IMG_L is present (e.g., exceeds a motion detection threshold). According to some example embodiments, the motion detection threshold may be a design parameter determined through empirical study.

The weight decision unit 111c may decide (e.g., determine) a weight WT to be applied to the detected motion region MT_D based on the motion region MT_D detected by the motion detecting unit 111b. For example, in the case where the magnitude of the long-exposure image IMG_L is relatively great in the motion region MT_D, a relatively small weight may be decided such that the magnitude of the long-exposure image IMG_L becomes relatively small in the motion region MT_D.

The signal pre-processing unit 111d may perform signal pre-processing on the long-exposure image IMG_L and may output a pre-processed image IMG_P. For example, the signal pre-processing unit 111d may perform various signal processing operations on the long-exposure image IMG_L to generate the pre-processed image IMG_P. In some example embodiments, a color artifact that is capable of occurring in signal processing (e.g., white balancing) performed on the high-quality image HDR later may be prevented or reduced by performing signal pre-processing on the long-exposure image IMG_L. A configuration and an operation of the signal pre-processing unit 111d will be more fully described with reference to drawings below.

The image combining unit 111e may generate the high-quality image HDR by applying the weight WT decided by the weight decision unit 111c to the pre-processed image IMG_P. In some example embodiments, the image combining unit 111e may generate the high-quality image HDR by combining the pre-processed image to which the weight WT is applied and another image (e.g., the short-exposure image IMG_S).

As described above, the image sensor 110 according to some example embodiments may perform motion compensation depending on the longer compensation scheme in the case of generating the high-quality image HDR. Also, compared to the conventional shorter compensation scheme, the SNR characteristic of the high-quality image HDR may be improved. Also, the image sensor 110 may perform pre-processing on the long-exposure image IMG_L, and thus, a color artifact that is capable of occurring after a signal processing operation of the image signal processor 120 may be prevented or reduced.

Figure 7:
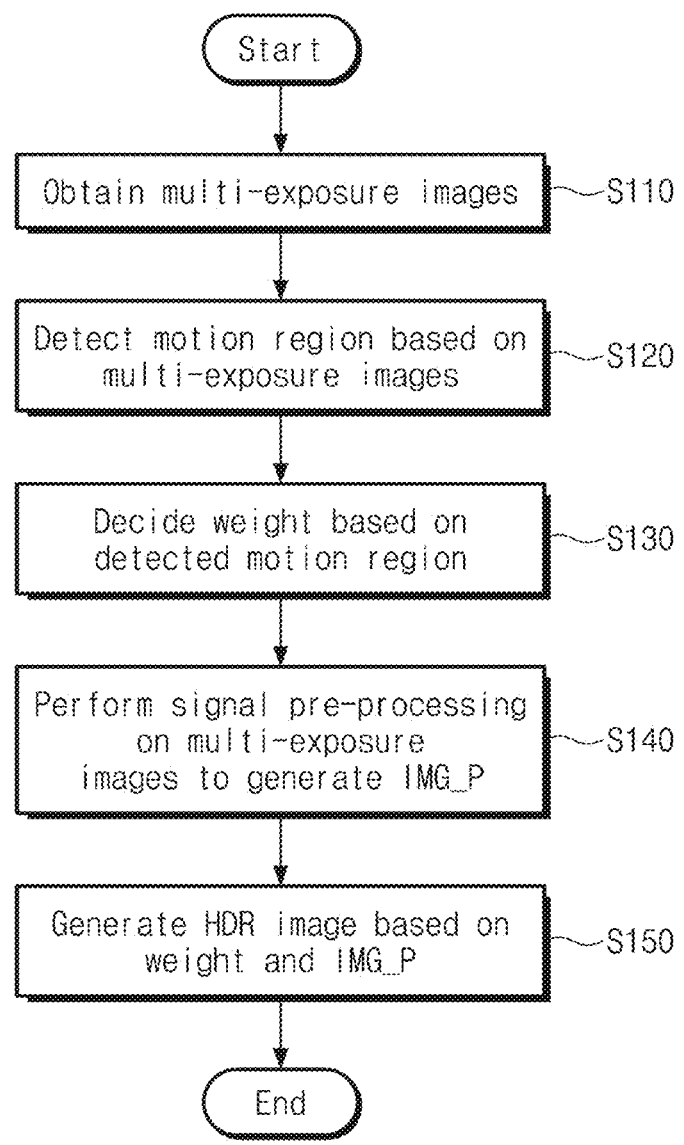
FIG. 7 is a flowchart illustrating an operation of an HDR module of FIG. 6.

FIG. 7 is a flowchart illustrating an operation of an HDR module of FIG. 6. A motion compensation operation according to the longer compensation scheme of the HDR module 111 is described with reference to FIG. 7. For convenience, the flowchart of FIG. 7 is described with reference to the image sensor 110. However, some example embodiments are not limited thereto. For example, the flowchart of FIG. 7 may be performed by a particular component (e.g., the HDR module 111) of the image sensor 110.

Referring to FIGS. 1, 2, 6, and 7, in operation S110, the image sensor 110 may obtain multi-exposure images. For example, as described with reference to FIGS. 3A and 3B, the image sensor 110 may obtain various images to which different exposure times are applied, from the plurality of sub-pixels sPX. In some example embodiments, the pattern separating unit 111a of the HDR module 111 may extract multi-exposure images (e.g., IMG_L and IMG_S) from the data obtained from the pixel array 112.

In operation S120, the image sensor 110 may detect a motion region based on the multi-exposure images. For example, the motion detecting unit 111b of the HDR module 111 may detect a motion region based on a magnitude difference of the multi-exposure images at a particular luminance. In some example embodiments, the particular luminance may correspond to a value for identifying a luminance period corresponding to each of the multi-exposure images. Alternatively or additionally, the particular luminance may indicate a minimum (or lowest and/or lower limit) luminance value at which a plurality of channel data of the long-exposure image IMG_L are all saturated. According to some example embodiments, the particular luminance may indicate a minimum (or lowest and/or lower limit) luminance value at which all of the color channel data of the long-exposure image IMG_L is saturated. In some example embodiments, the motion detecting unit 111b of the HDR module 111 may detect a motion based on a magnitude difference of the normalized multi-exposure images.

In operation S130, the image sensor 110 may decide (e.g., determine) a weight based on the detected motion. For example, the weight decision unit 111c of the HDR module 111 may decide the weight WT to be applied to a region corresponding to the detected motion. In some example embodiments, the weight WT may be decided based on a magnitude difference of the normalized multi-exposure images.

In operation S140, the image sensor 110 may perform signal pre-processing on the multi-exposure images and may generate the pre-processed image IMG_P. For example, the signal pre-processing unit 111d of the HDR module 111 may perform signal pre-processing on the multi-exposure images and may generate the pre-processed image IMG_P. In some example embodiments, the signal pre-processing may include the following: signal pre-processing based on a color transfer manner and/or signal pre-processing of a maximum value (or highest and/or upper limit value) limiting scheme. A configuration and an operation of the signal pre-processing unit 111d will be more fully described with reference to drawings below.

In operation S150, the image sensor 110 may generate the high-quality image HDR based on the pre-processed image IMG_P and the weight WT. For example, the image combining unit 111e of the HDR module 111 may generate the high-quality image HDR by applying the weight WT to the pre-processed image IMG_P. In some example embodiments, the high-quality image HDR may be generated by combining other multi-exposure images and a result obtained by applying the weight WT to the pre-processed image IMG_P.

Figure 8:
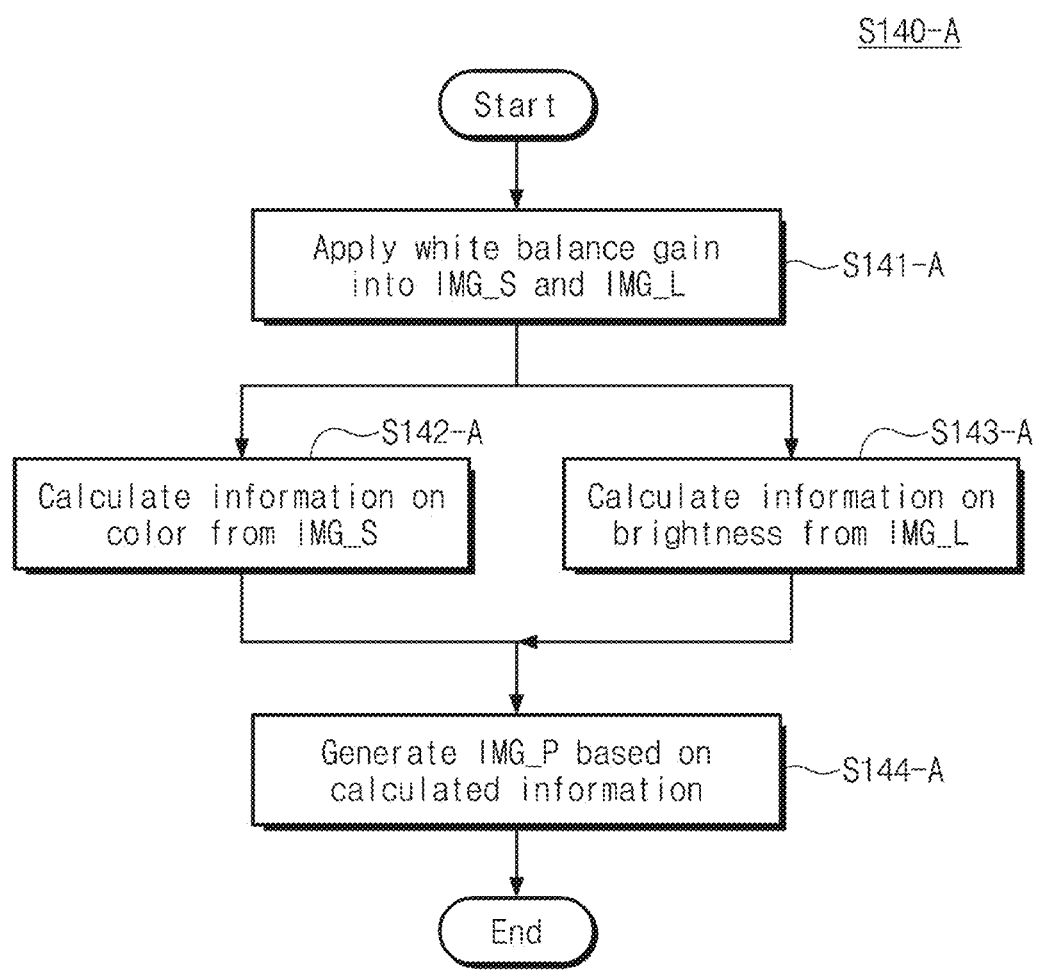
FIG. 8 is a flowchart illustrating some example embodiments of operation S140 of FIG. 7.
Figure 9:
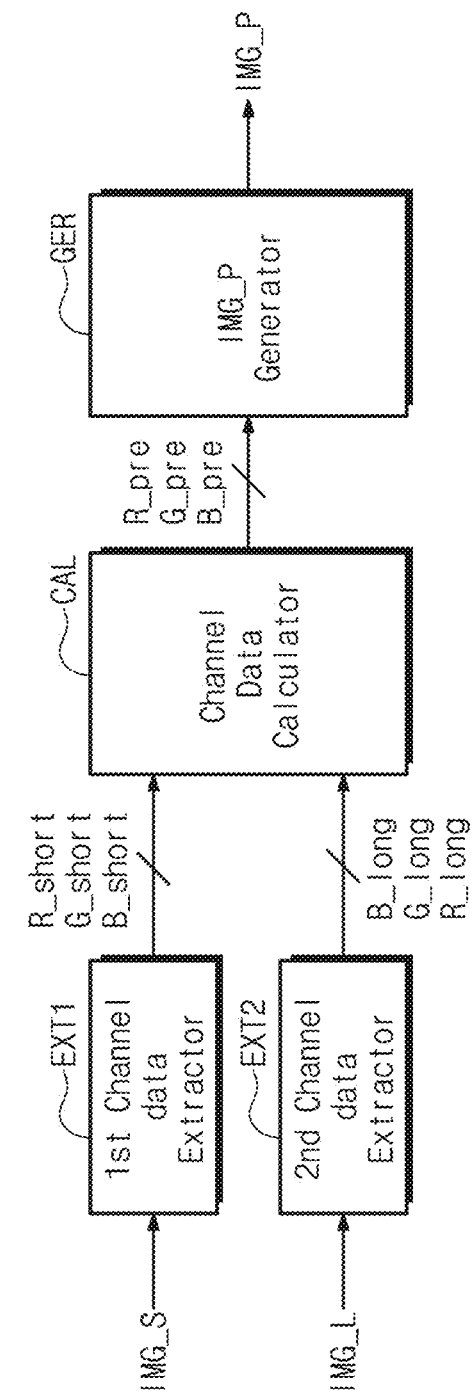
FIG. 9 is a block diagram illustrating a signal pre-processing unit performing an operation according to the flowchart of FIG. 8.

FIG. 8 is a flowchart illustrating some example embodiments of operation S140 of FIG. 7. FIG. 9 is a block diagram illustrating a signal pre-processing unit performing an operation according to the flowchart of FIG. 8. For convenience of description, an operation according to the flowchart of FIG. 8 and a configuration of a signal pre-processing unit of FIG. 9 are described on the basis of the long-exposure image IMG_L and the short-exposure image IMG_S, that is, two multi-exposure images. However, some example embodiments are not limited thereto.

Referring to FIGS. 8 and 9, a signal pre-processing unit 111d-A may include a first channel data extractor EXT1, a second channel data extractor EXT2, a channel data calculator CAL, and/or a pre-processed image generator GER. The signal pre-processing unit 111d-A may perform operation S140-A. In some example embodiments, the signal pre-processing unit 111d-A may be the same as or similar to the signal pre-processing unit 111d of FIG. 6, and operation S140-A may be the same as or similar to operation S140 of FIG. 7. Operation S140-A may include operation S141-A to operation S144-A. According to some example embodiments, operations described herein as being performed by the signal pre-processing unit 111d-A, the first channel data extractor EXT1, the second channel data extractor EXT2, the channel data calculator CAL, and/or the pre-processed image generator GER may be performed by processing circuitry.

In operation S141-A, the signal pre-processing unit 111d-A may apply a white balance gain WB_g to the short-exposure image IMG_S and the long-exposure image IMG_L. In some example embodiments, the white balance gain WB_g may be provided from the image signal processor 120 (refer to FIG. 1).

In operation S142-A, the signal pre-processing unit 111d-A may calculate information about a color from the short-exposure image IMG_S. In operation S143-A, the signal pre-processing unit 111d-A may calculate information about a color and/or brightness from the long-exposure image IMG_L.

For example, as illustrated in FIG. 9, the first channel data extractor EXT1 may extract information R_short, G_short, and B_short about a plurality of color channels from the short-exposure image IMG_S. The second channel data extractor EXT2 may extract information R_long, G_long, and B_long about a plurality of color channels from the long-exposure image IMG_L. In some example embodiments, the short-exposure image IMG_S and the long-exposure image IMG_L respectively provided to the first channel data extractor EXT1 and the second channel data extractor EXT2 may be image data to which the white balance gain WB_g is applied.

The channel data calculator CAL may calculate brightness information and color information to be applied to the pre-processed image IMG_P based on the information R_short, G_short, B_short, R_long, G_long, and B_long about the plurality of color channels. In a detailed example, a color channel corresponding to "G" from among RGB color channels may include information about brightness of an image. That is, the channel data calculator CAL may calculate brightness information (e.g., G_pre) to be applied to the pre-processed image IMG_P based on information (e.g., G_long) corresponding to the "G" color channel of the long-exposure image IMG_L from among the information R_short, G_short, B_short, R_long, G_long, and B_long about the plurality of color channels.

In contrast, color channels corresponding to "R" and "B" from among the plurality of color channels may include information about a color. In this case, the color information may be calculated from the short-exposure image IMG_S not saturated. That is, the channel data calculator CAL may calculate color information (e.g., R_pre and B_pre) to be applied to the pre-processed image IMG_P based on information (e.g., R_short and B_short) corresponding to the "R" and "B" color channels of the short-exposure image IMG_S from among the information R_short, G_short, B_short, R_long, G_long, and B_long about the plurality of color channels.

In some example embodiments, the brightness information (e.g., G_pre) and color information (e.g., R_pre and B_pre) to be applied to the pre-processed image IMG_P may be calculated by Equation 1 below.

$$R_{pre} = R_{short} \frac{G_{long}}{G_{short}} \quad \text{[Equation 1]}$$
$$G_{pre} = G_{long}$$
$$B_{pre} = B_{short} \frac{C_{long}}{G_{short}}$$

Reference signs included in Equation 1 are described above, and thus, additional description will be omitted to avoid redundancy.

The pre-processed image generator GER may combine the brightness information (e.g., G_pre) and color information (e.g., R_pre and B_pre) calculated by the channel data calculator CAL to generate the pre-processed image IMG_P. The generated pre-processed image IMG_P may be provided to the image combining unit 111e (refer to FIG. 6).

As described above, the image sensor 110 according to some example embodiments may perform motion compensation based on the longer compensation scheme. In this case, the image sensor 110 may perform a signal pre-processing operation on multi-exposure images to be used for the motion compensation. For example, the image sensor 110 may calculate color information to be applied to the pre-processed image IMG_P based on the short-exposure image IMG_S being in an unsaturated state and may calculate brightness information to be applied to the pre-processed image IMG_P based on the long-exposure image IMG_L being in a saturated state. That is, because the color information to be applied to the pre-processed image IMG_P is calculated based on the short-exposure image IMG_S being in an unsaturated state, a color artifact due to saturation of a long-exposure image occurring in the motion compensation according to the conventional longer compensation scheme may be prevented or reduced. Accordingly, even though white balancing is applied to the high-quality image HDR later, the color artifact may be prevented or reduced.

Figure 10:
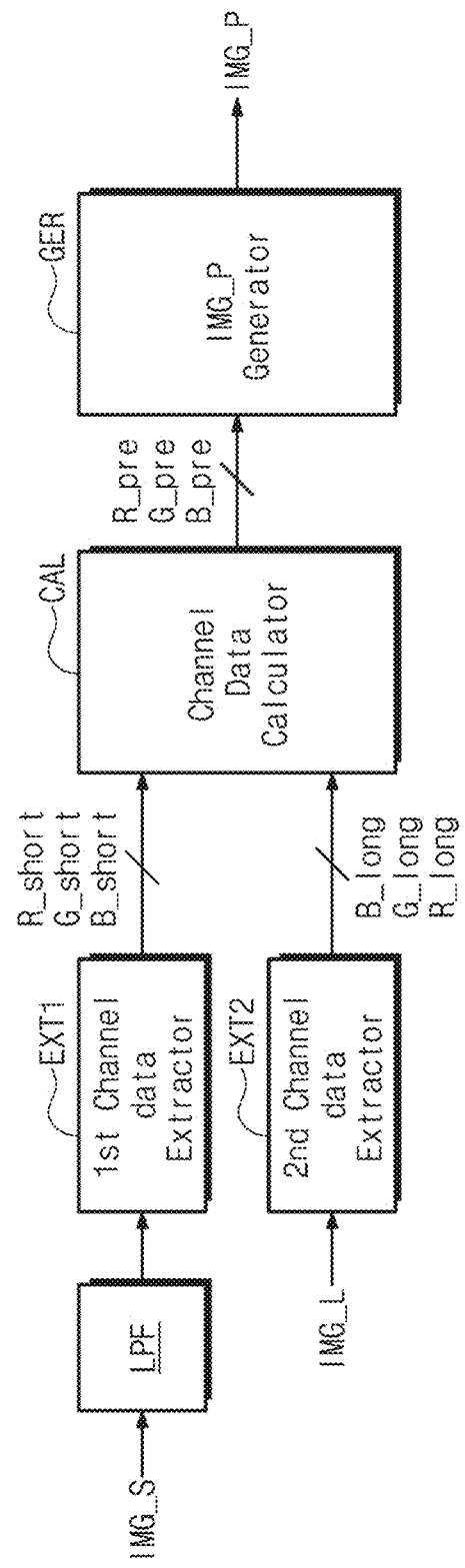
FIG. 10 is a block diagram illustrating some example embodiments of a signal pre-processing unit of FIG. 9.

FIG. 10 is a block diagram illustrating some example embodiments of a signal pre-processing unit of FIG. 9. For convenience of description, additional description associated with the above components will be omitted to avoid redundancy. Referring to FIG. 10, a signal pre-processing unit 111d-A' may include the first channel data extractor EXT1, the second channel data extractor EXT2, the channel data calculator CAL, the pre-processed image generator GER, and/or a low pass filter LPF. The first channel data extractor EXT1, the second channel data extractor EXT2, the channel data calculator CAL, and/or the pre-processed image generator GER are described above, and thus, additional description will be omitted to avoid redundancy. According to some example embodiments, operations described herein as being performed by the signal pre-processing unit 111d-A' and/or the low pass filter LPF may be performed by processing circuitry.

The color information R_pre and B_pre to be applied to the pre-processed image IMG_P may be calculated based on the short-exposure image IMG_S. However, as described above, because an exposure time is short, the short-exposure image IMG_S may include a relatively large quantity of noise. That is, in the case where the color information R_pre and B_pre to be applied to the pre-processed image IMG_P is calculated based on the short-exposure image IMG_S, the noise included in the short-exposure image IMG_S may be reflected to next calculation or may be amplified. To prevent this issue, or reduce the impact and/or occurrence of this issue, low pass filtering may be performed on the short-exposure image IMG_S. The low pass filter LPF may perform low pass filtering on the short-exposure image IMG_S to eliminate or reduce the noise included in the short-exposure image IMG_S. The first channel data extractor EXT1 may extract the channel information R-short, G_short, and B_short from the short-exposure image IMG_S experiencing the low pass filtering. The following operations are similar to the above-described operations, and thus, additional description will be omitted to avoid redundancy.

Figure 11:
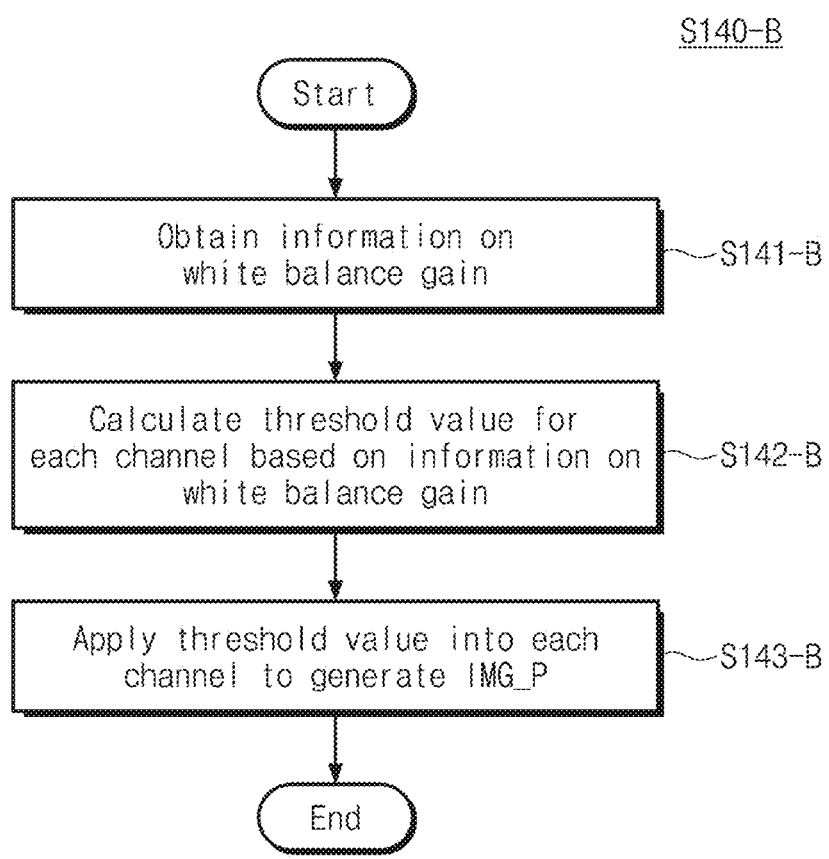
FIG. 11 is a flowchart illustrating some example embodiments of operation S140 of FIG. 7.
Figure 12:
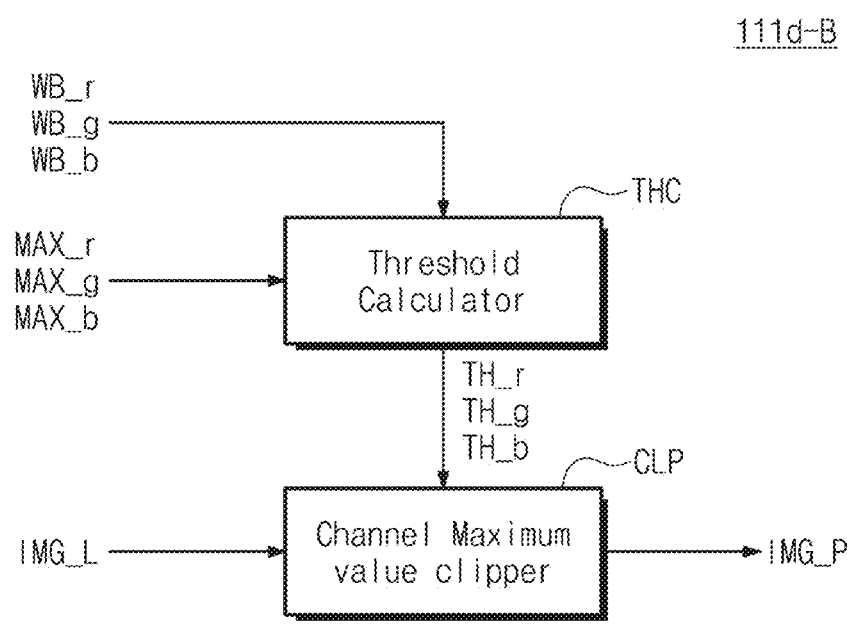
FIG. 12 is a block diagram illustrating a signal pre-processing unit performing an operation according to the flowchart of FIG. 11.

FIG. 11 is a flowchart illustrating some example embodiments of operation S140 of FIG. 7. FIG. 12 is a block diagram illustrating a signal pre-processing unit performing an operation according to the flowchart of FIG. 11. For convenience of description, an operation according to the flowchart of FIG. 11 and a configuration of a signal pre-processing unit of FIG. 12 are described on the basis of the long-exposure image IMG_L and the short-exposure image IMG_S, that is, two multi-exposure images. However, some example embodiments are not limited thereto.

Referring to FIGS. 11 and 12, a signal pre-processing unit 111d-B may include a threshold calculator THC and a channel maximum value clipper CLP. The signal pre-processing unit 11d-B may perform operation S140-B of FIG. 11. In some example embodiments, the signal pre-processing unit 11d-B may be the same as or similar to the signal pre-processing unit 111d of FIG. 6, and operation S140-B may be the same as or similar to operation S140 of FIG. 7. Operation S140-B may include operation S141-B to operation S143-B. According to some example embodiments, operations described herein as being performed by the signal pre-processing unit 111d-B, the threshold calculator THC and/or the channel maximum value clipper CLP may be performed by processing circuitry.

In operation S141-B, the signal pre-processing unit 111d-B may obtain information about a white balance gain. For example, white balancing may be performed by the image signal processor 120 (refer to FIG. 2). The signal pre-processing unit 111d-B may receive information about the white balance gain from the image signal processor 120.

In operation S142-B, the signal pre-processing unit 111d-B may calculate a threshold value for each channel based on the information about the white balance gain. In operation S143-B, the signal pre-processing unit 111d-B may apply the threshold value to each channel to generate the pre-processed image IMG_P.

For example, as described above, in the case where the motion compensation is performed according to the longer compensation scheme and all channels of the long-exposure image IMG_L are saturated, a color artifact may occur in a particular color in a next white balancing operation. To prevent this issue, or reduce the impact and/or occurrence of this issue, a maximum value (or highest and/or upper limit value) of a particular channel may be clipped to the calculated threshold value.

In a detailed example, as illustrated in FIG. 12, the threshold calculator THC of the signal pre-processing unit 111d-B may receive information WB_r, WB_g, and WB_b about the white balance gain and information MAX_r, MAX_g, and MAX_b about maximum values (or highest and/or upper limit value) for respective channels of the long-exposure image IMG_L. The threshold calculator THC may calculate threshold values TH_r, TH_g, and TH_b to be used to clip a maximum value (or highest and/or upper limit value) of each channel of the long-exposure image IMG_L, based on the received information. According to some example embodiments, the channel maximum value clipper CLP may receive the long-exposure image IMG_L and the calculated threshold values TH_r, TH_g, and TH_b. The channel maximum value clipper CLP may clip a maximum value (or highest and/or upper limit value) of each channel of the long-exposure image IMG_L based on the calculated threshold values TH_r, TH_g, and TH_b to obtain (e.g., generate) the pre-processed image IMG_P. According to some example embodiments, the channel maximum value clipper CLP may clip the maximum values (or highest and/or upper limit values) of each color channel of the long-exposure image IMG_L such that the maximum values (or highest and/or upper limit values) of each color channel is limited to its respective calculated threshold value. According to some example embodiments, at least one of a maximum value (or highest and/or upper limit value) of red channel data of the pre-processed image or a maximum value (or highest and/or upper limit value) of blue channel data of the pre-processed image is smaller than a maximum value (or highest and/or upper limit value) of green channel data of the pre-processed image. In some example embodiments, the threshold values TH_r, TH_g, and TH_b may be calculated by Equation 2 below.

$$TH_r = \frac{MAX_r}{\frac{WB_r}{WB_g} \times \frac{LE}{SE}}$$ [Equation 2]

$$TH_g = \frac{MAX_g}{\frac{LE}{SE}}$$

$$TH_b = \frac{MAX_b}{\frac{WB_b}{WB_g} \times \frac{LE}{SE}}$$

Referring to Equation 2, "LE/SE" is a normalization factor to be used in a normalization operation; the remaining variables are described above, and thus, additional description will be omitted to avoid redundancy.

In some example embodiments, it is assumed that data of each channel are 12 bits and a ratio of a white balance gains of respective channels is "WB_r:WB_g:WB_b=1.57:1: 1.16". In this case, each of maximum values (or highest and/or upper limit values) MAX_r, MAX_g, and MAX_b of the respective channels may be "4095". Accordingly, the threshold values TH_r, TH_g, and TH_b of the channels calculated based on the above values and Equation 2 may be "935", "1468", and "1265", respectively. Table 2 below shows maximum values (or highest and/or upper limit values) of respective channels before and after applying white balancing to the high-quality image HDR experiencing the motion compensation depending on the longer compensation scheme, and maximum values (or highest and/or upper limit values) of the respective channels before and after applying white balancing to the high-quality image HDR experiencing the motion compensation with reference to FIGS. 11 and 12.

TABLE 2

|  | Conventional (hdr) | | (HDR) | |
| --- | --- | --- | --- | --- |
|  | Before WB | After WB | Before WB | After WB |
| Red Channel | 1468 | 2304 | 935 | 1468 |
| Green Channel | 1468 | 1468 | 1468 | 1468 |
| Blue Channel | 1468 | 1688 | 1265 | 1467 |

As understood from Table 2, in a conventional case, after applying white balancing, a maximum value (or highest and/or upper limit value) of a red channel is relatively high compared with maximum values (or highest and/or upper limit values) of the remaining channels. This means that a color artifact of a red color occurs in a region to which the motion compensation is applied. In contrast, referring to FIGS. 11 and 12, in the motion compensation procedure, by clipping a maximum value (or highest and/or upper limit value) of a particular channel based on information about a white balance gain, a difference between maximum values (or highest and/or upper limit values) of respective channels are not almost present even after applying white balancing. This means that a color artifact does not occur after applying white balancing. As described above, according to some example embodiments, the image sensor 110 may perform motion compensation depending on the longer compensation scheme. Accordingly, in the case of the motion compensation according to the conventional longer compensation scheme, a color artifact may occur in the region to which the motion compensation is applied; in contrast, the image sensor 110 according to some example embodiments may perform signal pre-processing on the long-exposure image IMG_L and thus may prevent a color artifact, or reduce the magnitude and/or occurrence of the color artifact, in the region to which the motion compensation is applied. Accordingly, the quality of the high-quality image HDR generated from the image sensor 110 may be further improved.

Figure 13A:
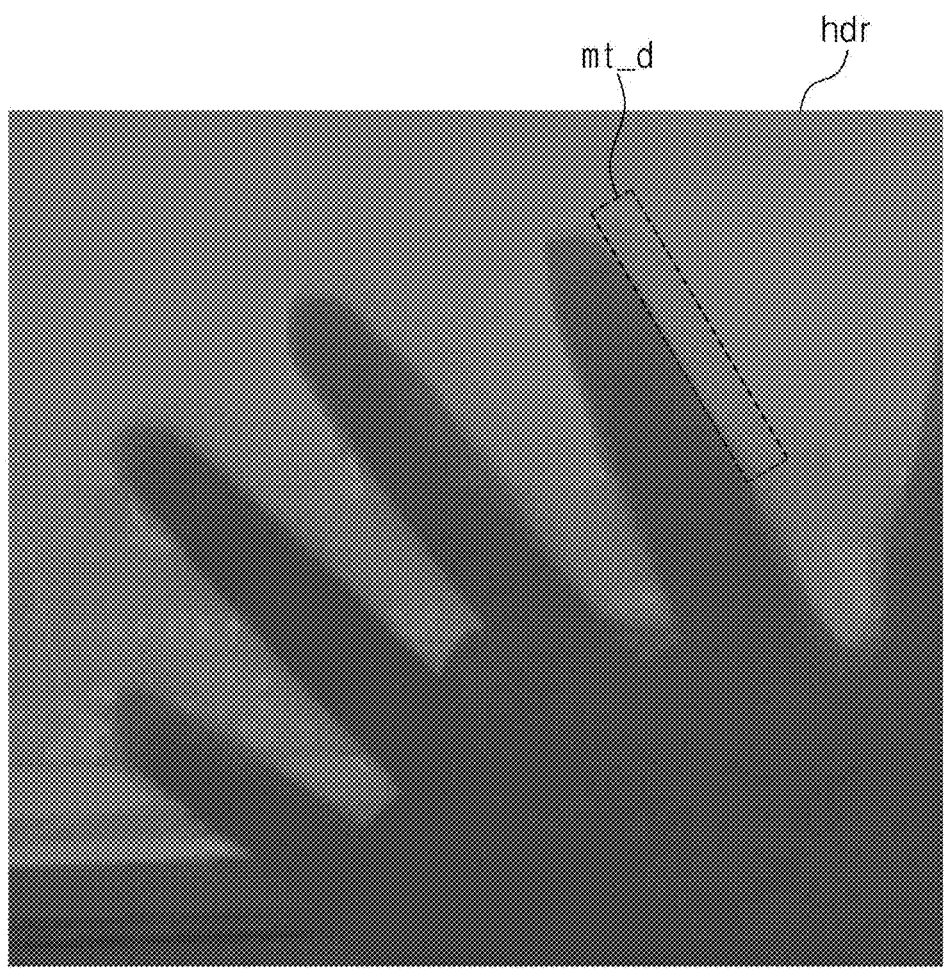
FIGS. 13A to 13C are diagrams for describing a color artifact prevention or reduction effect according to some example embodiments.
Figure 13B:
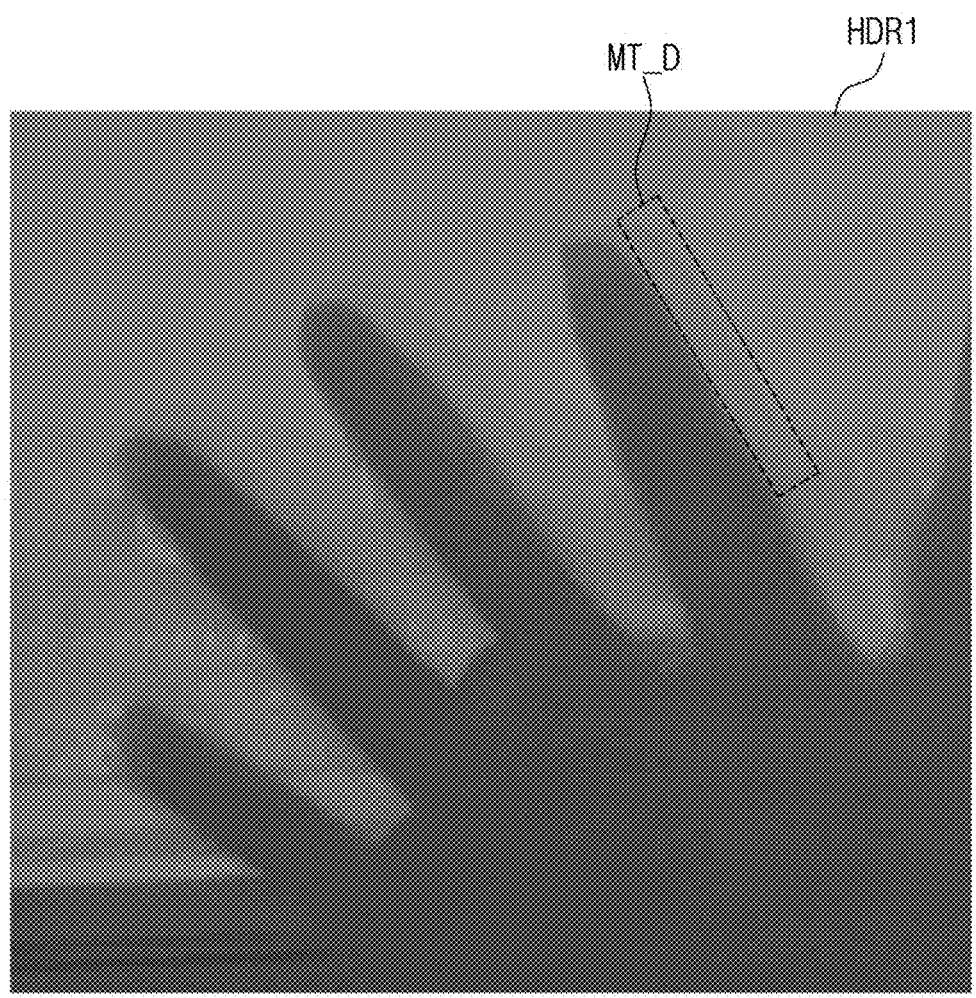
Figure 13C:
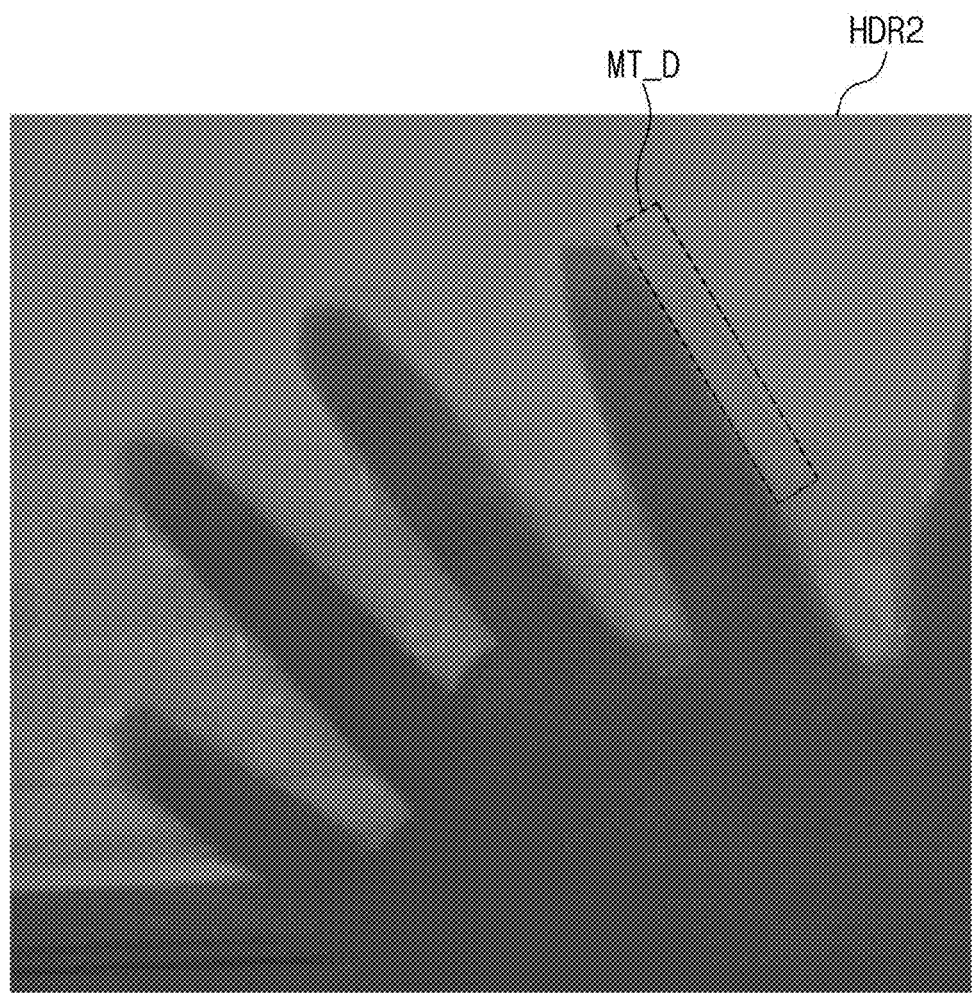

FIGS. 13A to 13C are diagrams for describing a color artifact prevention or reduction effect according to some example embodiments. A drawing of FIG. 13A is a photo after white balancing is applied to the high-quality image hdr experiencing motion compensation according to the conventional longer compensation scheme. A drawing of FIG. 13B is a photo after white balancing is applied to the high-quality image HDR1 experiencing motion compensation according to some example embodiments as discussed in association with FIGS. 8 and 9. A drawing of FIG. 13C is a photo after white balancing is applied to the high-quality image HDR2 experiencing motion compensation according to some example embodiments as discussed in association with FIGS. 11 and 12.

As understood from the conventional high-quality image hdr of FIG. 13A, a color artifact of a red color occurs in a region mt_d to which motion compensation is applied. In contrast, as understood from FIGS. 13B and 13C, the color artifact appearing at the conventional high-quality image hdr does not occur in motion compensation-applied regions MT_D of the high-quality image HDR1 and HDR2 generated from the image sensor 110 according to some example embodiments. That is, in the motion compensation procedure according to the longer compensation scheme, as signal pre-processing is applied to the long-exposure image IMG_L, a color artifact capable of occurring in a next white balancing procedure may be prevented or reduced.

In some example embodiments, as illustrated in FIG. 13B, according to the motion compensation scheme described with reference to FIGS. 8 to 10, because a color of the motion region MT_D is similar to a color of a moving object, a natural high-quality image HDR may be generated. In some example embodiments, as illustrated in FIG. 13C, according to the motion compensation scheme described with reference to FIGS. 11 and 12, the computational burden associated with the signal pre-processing of the long-exposure image IMG_L decreases.

Figure 14A:
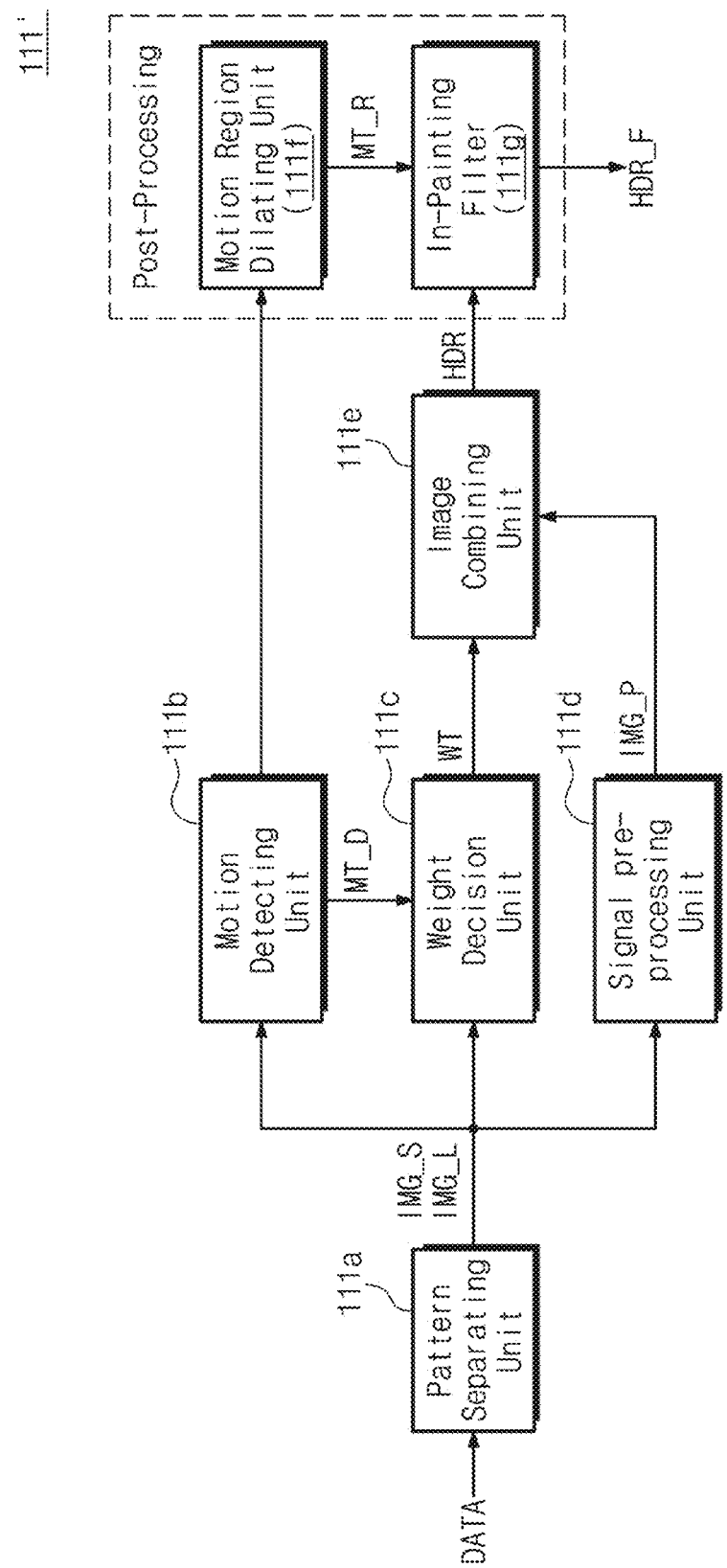
FIG. 14A is a block diagram illustrating an HDR module according to some example embodiments.
Figure 14B:
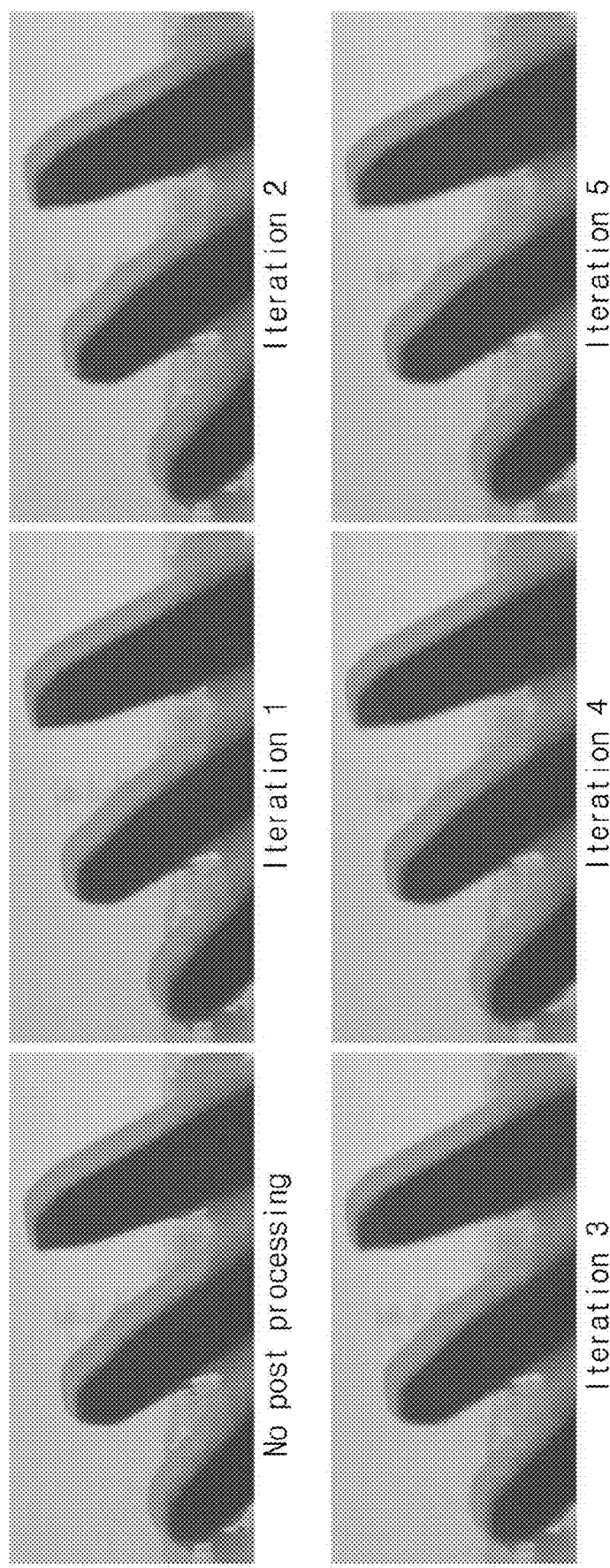
FIG. 14B depicts diagrams for describing an effect of iteration of a post-processing procedure of FIG. 14A.

FIG. 14A is a block diagram illustrating an HDR module according to some example embodiments. FIG. 14B is a diagrams for describing an effect of iteration of a post-processing procedure of FIG. 14A. For convenience of description, additional description associated with the above components will be omitted to avoid redundancy.

Referring to FIGS. 1, 14A, and 14B, an HDR module 111' may include the pattern separating unit 111a, the motion detecting unit 111b, the weight decision unit 111c, the signal pre-processing unit 111d, the image combining unit 111e, a motion region dilating unit 111f, and/or an in-painting filter 111g. The pattern separating unit 111a, the motion detecting unit 111b, the weight decision unit 111c, the signal pre-processing unit 111d, and/or the image combining unit 111e are described above, and thus, additional description will be omitted to avoid redundancy. According to some example embodiments, operations described herein as being performed by the HDR module 111', the motion region dilating unit 111f, and/or the in-painting filter 111g may be performed by processing circuitry.

The motion region dilating unit 111f may be configured to dilate the motion region MT_D detected from the motion detecting unit 111b. For example, in a partial region of an image, even though a motion exists, a boundary region may be present in a region that is not detected as the motion region. This boundary region may appear in the form of a strong edge. The quality of image may be improved by decreasing the strong edge of the boundary region. As such, the motion region dilating unit 111f may dilate the detected motion region MT_D and may decide a dilated motion region MT_R.

The in-painting filter 111g may perform in-painting filtering on the dilated motion region MT_R. The in-painting filtering may indicate a filtering technique for performing low pass filtering by applying a weight to the remaining pixels other than a center pixel of the dilated motion region MT_R.

In some example embodiments, the motion region dilating unit 111f and the in-painting filter 111g (and/or operations performed thereby) may be included in a post-processing procedure of the HDR module 111'. In some example embodiments, as the above post-processing procedure is iterated (e.g., a defined quantity of iterations and/or a variable number of iterations up to the defined quantity of iterations), an edge region of the high-quality image HDR may become e smoother. For example, as illustrated in FIG. 14B, as the post-processing procedure is iterated on the high-quality image HDR, the strength of the edge region may become weaker (e.g., the edge region becoming smoother). According to some example embodiments, the defined quantity of iterations may be a design parameter determined through empirical study.

Figure 15:
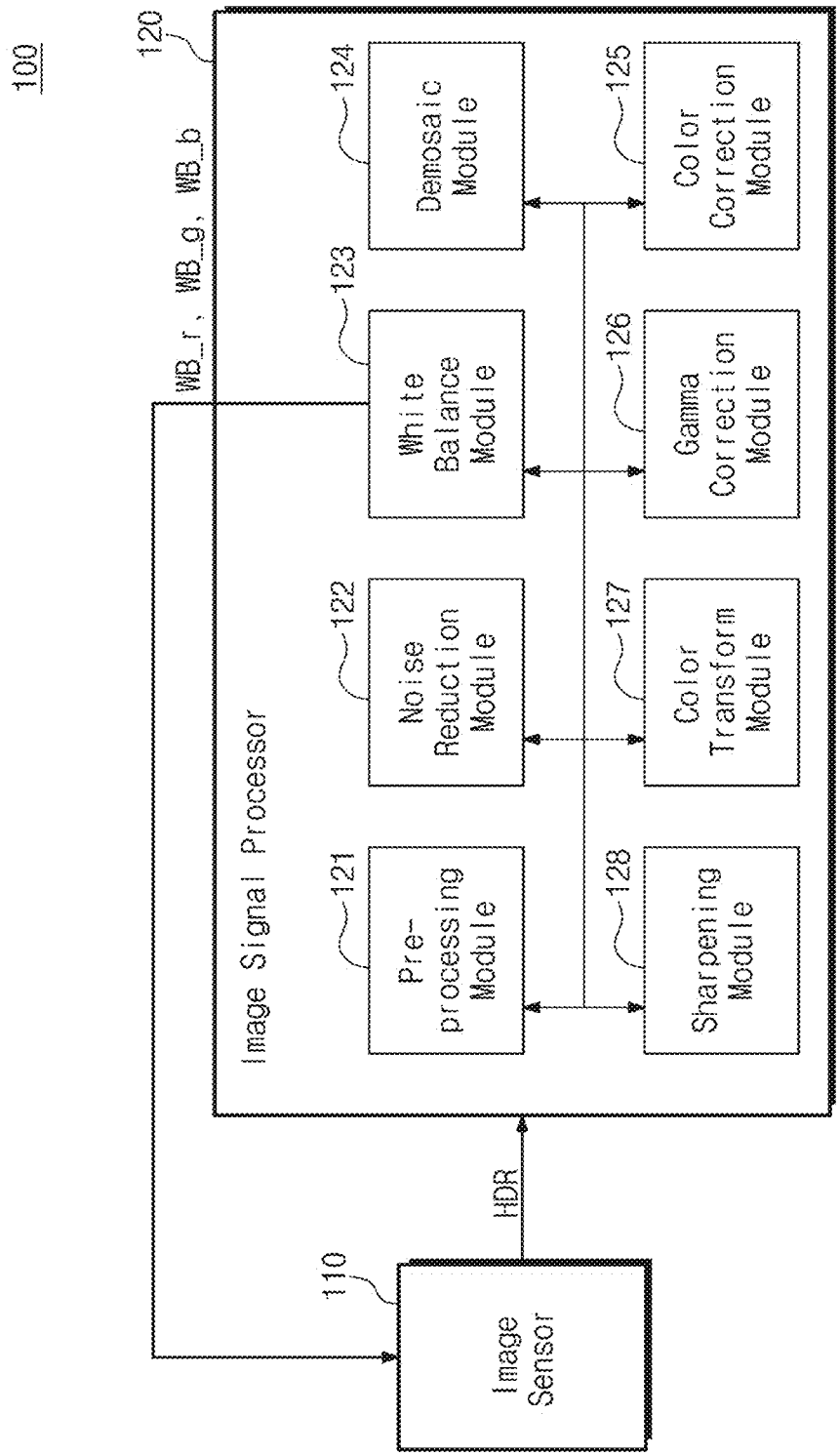
FIG. 15 is a block diagram illustrating an image signal processor of an image device of FIG. 1 in detail.

FIG. 15 is a block diagram illustrating an image signal processor of an image device of FIG. 1 in detail. Referring to FIGS. 1 and 15, the image device 100 may include the image sensor 110 and the image signal processor 120. The image sensor 110 may output the high-quality image HDR described with reference to FIGS. 1 to 14B.

The image signal processor 120 may perform signal processing and/or image processing on the high-quality image HDR received from the image sensor 110. The image signal processor 120 may include a pre-processing module 121, a noise reduction module 122, a white balance module 123, a demosaic module 124, a color correction module 125, a gamma correction module 126, a color transform module 127, and/or a sharpening module 128. According to some example embodiments, operations described herein as being performed by the pre-processing module 121, the noise reduction module 122, the white balance module 123, the demosaic module 124, the color correction module 125, the gamma correction module 126, the color transform module 127, and/or the sharpening module 128 may be performed by processing circuitry.

The pre-processing module 121 may perform signal processing on the high-quality image HDR received from the image sensor 110. For example, the pre-processing module 121 may transform data of the high-quality image HDR so as to be available (e.g., in a form more compatible with, and/or more easily processed by, other modules of the image signal processor 120) at next functional blocks (e.g., the noise reduction module 122).

The noise reduction module 122 may be configured to reduce noise of the high-quality image HDR received from the image sensor 110. For example, the noise reduction module 122 may be configured to reduce fixed-pattern noise or temporal random noise according to the color filter CFA of the image sensor 110.

The white balance module 123 may apply white balance to the noise-reduced high-quality image HDR. For example, the white balance module 123 may adjust a white balance gain of the noise-reduced high-quality image HDR and may perform a white balancing operation based on the adjusted white balance gain. In some example embodiments, information WB_r, WB_g, and WB_b about the white balance gain (e.g., corresponding to the different channels of the noise-reduced high-quality image HDR) that is used in the white balance module 123 may be provided to the image sensor 110.

The demosaic module 124 may be configured to transform an output of the white balance module 123 (e.g., a white balanced image) to full-color data (e.g., a full-color image). For example, the output of the white balance module 123 may have a data format (e.g., a Bayer format or a tetra format) according to a CFA pattern of the image sensor 110. The demosaic module 124 may be configured to transform the data format according to the CFA pattern of the image sensor 110 to an RGB format.

The color correction module 125 may be configured to correct a color of a high-quality image transformed to the RGB format. According to some example embodiments, the color correction module 125 may correct a color of the full-color image output from the demosaic module 124 to obtain a color corrected image. The gamma correction module 126 may be configured to correct a gamma value of an output provided from the color correction module 125.

According to some example embodiments, the gamma correction module 126 may correct a gamma value of the color corrected image output from the color correction module 125 to obtain a gamma corrected image.

The color transform module 127 may be configured to transform an output of the gamma correction module 126 so as to correspond to a specific format. For example, the output of the gamma correction module 126 may have the RGB format. The color transform module 127 may transform the RGB format to a YUV format. According to some example embodiments, the color transform module 127 may transform the gamma corrected image output from the gamma correction module 126 in correspondence with a particular format to obtain a format transformed image. The sharpening module 128 may adjust a sharpness of an image based on the output from the color transform module 127 and may output a final high-quality image. According to some example embodiments, the sharpening module 128 may adjust a sharpness of the format transformed image to obtain a sharpened image (e.g., the final high-quality image).

The final high-quality image generated from the image signal processor 120 may be provided to an external display device and/or an external storage device.

The configuration of the image signal processor 120 illustrated in FIG. 15 is an example, and some example embodiments are not limited thereto. For example, the image signal processor 120 may further include additional components (e.g., modules) configured to perform another signal processing operation, as well as the above components (e.g., modules).

Figure 16:
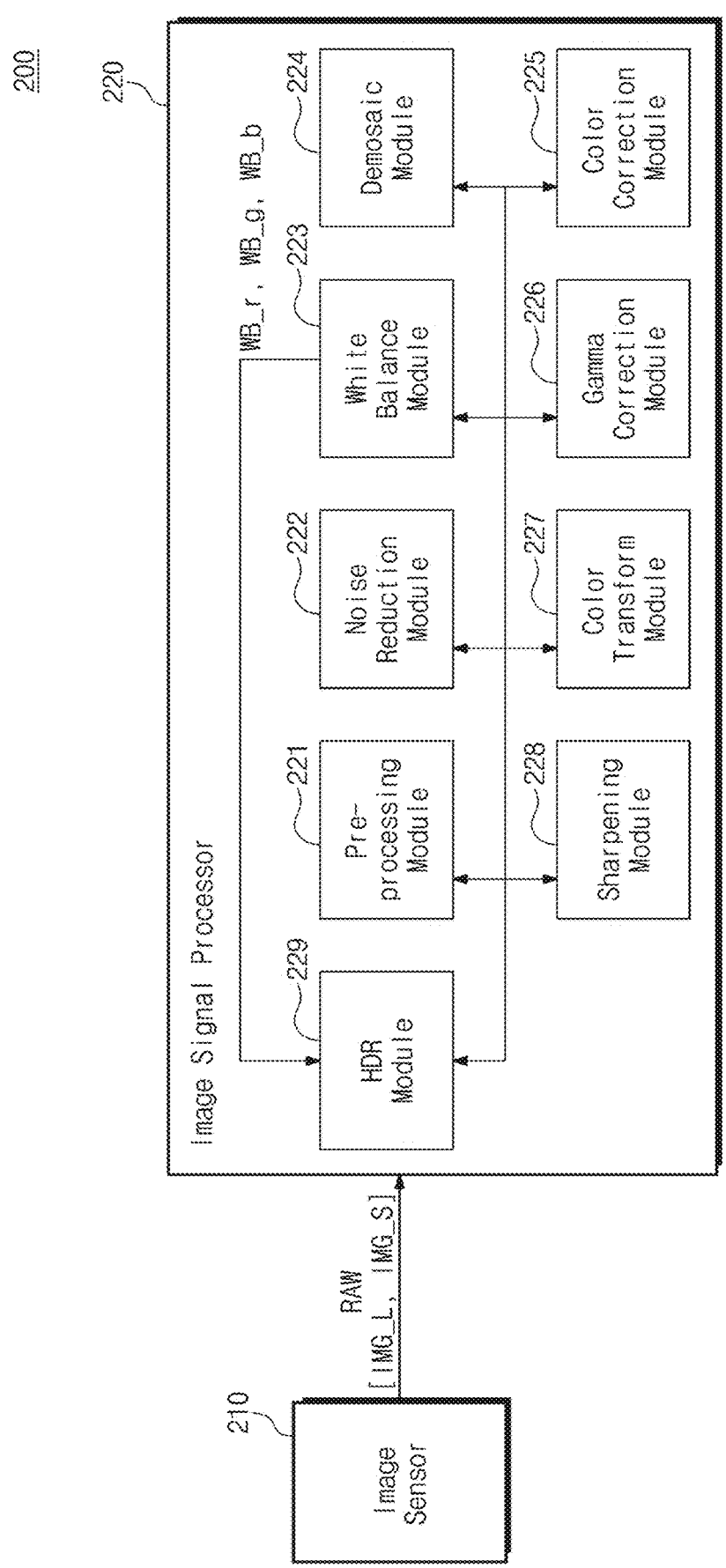
FIG. 16 is a block diagram illustrating an image device according to some example embodiments.

FIG. 16 is a block diagram illustrating an image device according to some example embodiments. Referring to FIG. 16, an image device 200 may include an image sensor 210 and/or an image signal processor 220. Unlike the image sensor 110 described above, the image sensor 210 may be configured to output raw data RAW of an image. The raw data RAW may include the long-exposure image IMG_L and the short-exposure image IMG_S. That is, the image sensor 210 of FIG. 16 may not include an HDR module configured to generate the high-quality image HDR.

The image signal processor 220 may include a pre-processing module 221, a noise reduction module 222, a white balance module 223, a demosaic module 224, a color correction module 225, a gamma correction module 226, a color transform module 227, a sharpening module 228, and/or an HDR module 229. The pre-processing module 221, the noise reduction module 222, the white balance module 223, the demosaic module 224, the color correction module 225, the gamma correction module 226, the color transform module 227, and/or the sharpening module 228 are the same as or similar to the pre-processing module 121, the noise reduction module 122, the white balance module 123, the demosaic module 124, the color correction module 125, the gamma correction module 126, the color transform module 127, and/or the sharpening module 128, respectively, described above, and thus, additional description will be omitted to avoid redundancy. According to some example embodiments, operations described herein as being performed by the image device 200, the image sensor 210, the image signal processor 220 and/or the HDR module 229 may be performed by processing circuitry.

The HDR module 229 of the image signal processor 220 may generate the high-quality image HDR based on the raw data RAW provided from the image sensor 210. For example, the HDR module 229 may perform motion compensation based on the scheme described with reference to FIGS. 1 to 14B. In some example embodiments, the HDR module 229 of the image signal processor 220 may be configured to receive the information WB_r, WB_g, and WB_b about the white balance gain from the white balance module 223 of the image signal processor 220.

Figure 17:
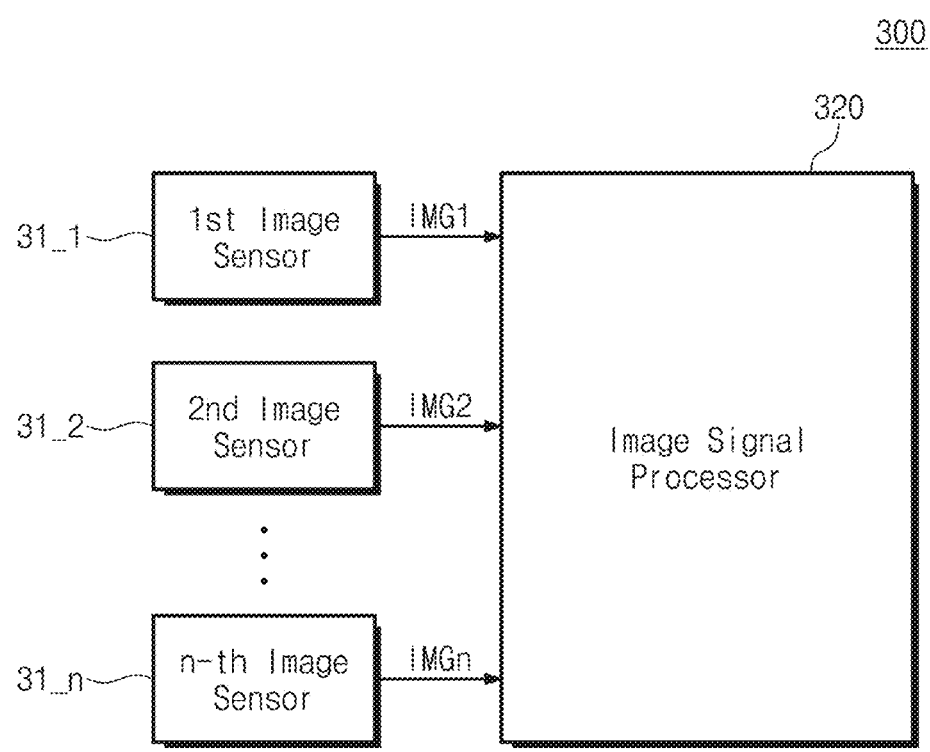
FIG. 17 is a block diagram illustrating an image device according to some example embodiments.

FIG. 17 is a block diagram illustrating an image device according to some example embodiments. Referring to FIG. 17, an image device 300 may include a plurality of image sensors $31\_1$ to $31\_n$ (e.g., the $1^{st}$ image sensor $31\_1$, the $2^{nd}$ image sensor $31\_2$, ... the $n^{th}$ image sensor $31n$) and/or an image signal processor 320. According to some example embodiments, each of the image sensors $31\_1$ to $31\_n$ is the same as or similar to the image sensor 110, and the image signal processor 320 is the same as or similar to the image signal processor 320, and thus, additional description will be omitted to avoid redundancy.

The plurality of image sensors $31\_1$ to $31\_n$ may be configured to output a plurality of images IMG1 to IMGn (e.g., the $1^{st}$ image IMG1, the $2^{nd}$ image IMG2, ... the $n^{th}$ image IMGn). The plurality of images IMG1 to IMGn may have different characteristics. For example, the plurality of images IMG1 to IMGn may be images photographed at different magnifications. The plurality of images IMG1 to IMGn may be images photographed at different exposure times. The plurality of images IMG1 to IMGn may be images having different resolutions. The above configuration is an example, and some example embodiments are not limited thereto.

The image signal processor 320 may receive the plurality of images IMG1 to IMGn from the plurality of image sensors $31\_1$ to $31\_n$. The image signal processor 320 may perform signal processing and/or image processing on the plurality of images IMG1 to IMGn. In some example embodiments, the image signal processor 320 may generate the high-quality image HDR based on the plurality of images IMG1 to IMGn depending on the method or configuration described with reference to FIGS. 1 to 14B.

As described above, an image sensor according to some example embodiments may perform motion compensation depending on the longer compensation scheme. In this case, because an image sensor or an image signal processor performs signal pre-processing on a long-exposure image, even though all channels of the long-exposure image are saturated, a color artifact does not occur, or is reduced relative to that produced by conventional image sensors and image signal processors, after the white balancing is applied. Accordingly, an image sensor providing a high-quality image of an improved quality and an operation method thereof are provided.

Figure 18:
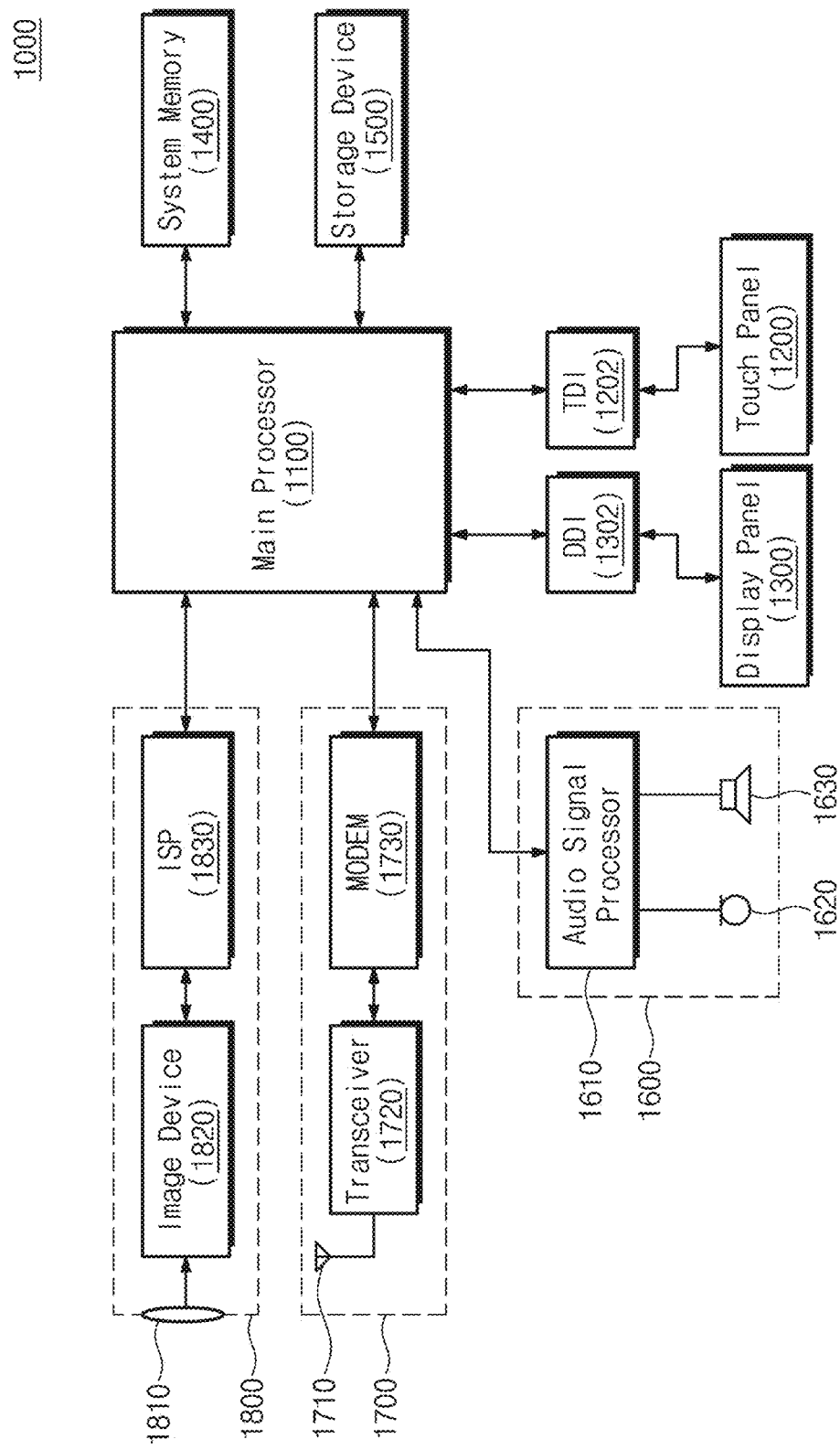
FIG. 18 is a block diagram illustrating an electronic device according to some example embodiments.

FIG. 18 is a block diagram illustrating an electronic device according to some example embodiments. Referring to FIG. 18, an electronic device 1000 may include a main processor 1100, a touch panel 1200, a touch driver integrated circuit 1202, a display panel 1300, a display driver integrated circuit 1302, a system memory 1400, a storage device 1500, an image processor 1800, a communication block 1700, and/or an audio processor 1600. In some example embodiments, the electronic device 1000 may be one or more of various electronic devices such as a portable communication terminal, a personal digital assistant (PDA), a portable media player (PMP), a digital camera, a smartphone, a tablet computer, a laptop computer, and/or a wearable device.

The main processor 1100 may control overall operations of the electronic device 1000. The main processor 1100 may control/manage operations of the components of the electronic device 1000. The main processor 1100 may process various operations for operating the electronic device 1000.

The touch panel 1200 may be configured to sense a touch input from a user under control of the touch driver integrated circuit 1202. The display panel 1300 may be configured to display image information under control of the display driver integrated circuit 1302.

The system memory 1400 may store data used for an operation of the electronic device 1000. For example, the system memory 1400 may include a volatile memory such as a Static Random Access Memory (SRAM), a Dynamic RAM (DRAM), and/or a Synchronous DRAM (SDRAM), and/or a nonvolatile memory such as a Phase-change RAM (PRAM), a Magneto-resistive RAM (MRAM), a Resistive RAM (ReRAM), and/or a Ferroelectric RAM (FRAM).

The storage device 1500 may store data regardless of whether power is supplied. For example, the storage device 1500 may include at least one of various nonvolatile memories such as a flash memory, a PRAM, an MRAM, a ReRAM, and/or a FRAM. For example, the storage device 1500 may include an embedded memory and/or a removable memory of the electronic device 1000.

The audio processor 1600 may process an audio signal by using an audio signal processor 1610. The audio processor 1600 may receive an audio input through a microphone 1620 and/or may provide an audio output through a speaker 1630.

The communication block 1700 may exchange signals with an external device/system through an antenna 1710. A transceiver 1720 and a modulator/demodulator (MODEM) 1730 of the communication block 1700 may process signals exchanged with the external device/system in compliance with at least one of various wireless communication protocols, such as Long Term Evolution (LTE), Worldwide Interoperability for Microwave Access (WiMax), Global System for Mobile communication (GSM), Code Division Multiple Access (CDMA), Bluetooth, Near Field Communication (NFC), Wireless Fidelity (Wi-Fi), and/or Radio Frequency Identification (RFID).

The image processor 1800 may receive a light through a lens 1810. An image device 1820 and an image signal processor 1830 included in the image processor 1800 may generate image information about an external object, based on a received light. In some example embodiments, the image device 1820 may be an image sensor described with reference to FIGS. 1 to 17 (e.g., the image sensor 110) or may generate the high-quality image HDR based on the operation described with reference to FIGS. 1 to 17. According to some example embodiments, operations described herein as being performed by the electronic device 1000 may be performed by processing circuitry (e.g., the main processor 1100, the touch driver integrated circuit 1202, the display driver integrated circuit 1302, the audio signal processor 1610, the MODEM 1730, the image device 1820 and/or the image signal processor 1830).

According to some example embodiments, an image sensor may perform motion compensation depending on a longer compensation scheme. In this case, because an image sensor or an image signal processor performs signal pre-processing on a long-exposure image, even though all channels of the long-exposure image are saturated, a color artifact does not occur after the white balancing is applied. Accordingly, an image device including an image sensor and an image signal processor providing a high-quality image of an improved quality, and an operation method of the image sensor are provided.

The various operations of methods described above may be performed by any suitable device capable of performing the operations, such as processing circuitry. For example, the operations of methods described above may be performed by various hardware and/or software implemented in some form of hardware (e.g., processor, ASIC, etc.).

The software may comprise an ordered listing of executable instructions for implementing logical functions, and may be embodied in any "processor-readable medium" for use by or in connection with an instruction execution system, apparatus, or device, such as a single or multiple-core processor or processor-containing system.

The blocks or operations of a method or algorithm and functions described in connection with some example embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

While some example embodiments have been described, it will be apparent to those of ordinary skill in the art that various changes and modifications may be made thereto without departing from the spirit and scope of some example embodiments as set forth in the following claims.

What is claimed is:

1. An operation method of an image sensor, the method comprising:
   detecting a motion region based on a first image and a second image to obtain a detected motion region, the first image corresponding to a first exposure time and the second image corresponding to a second exposure time, the second exposure time being shorter than the first exposure time;
   determining a weight for the detected motion region;
   performing signal pre-processing on the first image to generate a pre-processed image, the signal pre-processing including,
      using brightness information of the first image and color information of the second image to generate the pre-processed image, or
      clipping maximum values of color channel data of the first image based on a plurality of threshold values to generate the pre-processed image; and
   outputting a third image based on the pre-processed image and the weight.

2. The method of claim 1, wherein the detecting the motion region comprises:
   normalizing the first image and the second image to obtain a normalized first image and a normalized second image;
   comparing a magnitude of the normalized first image corresponding to a first region and a magnitude of the normalized second image corresponding to the first region to obtain a comparison result, the first region having a first luminance; and
   detecting the first region as the detected motion region based on the comparison result.

3. The method of claim 2, wherein the first luminance corresponds to a minimum luminance at which color channel data of the first image is saturated.

4. The method of claim 1, wherein
   each of the first image and the second image includes first color channel data, second color channel data and third color channel data; and the performing the signal pre-processing on the first image comprises,
calculating the brightness information based on the first color channel data of the first image,
calculating the color information based on the second color channel data and the third color channel data of the second image, and
generating the pre-processed image based on the brightness information and the color information.

5. The method of claim 4, wherein the calculating the color information comprises:
calculating first color information based on a product of a first ratio and the second color channel data of the second image, the first ratio being of the first color channel data of the first image to the first color channel data of the second image; and
calculating second color information based on a product of the first ratio and the third color channel data of the second image.

6. The method of claim 1, wherein
each of the first image and the second image includes first color channel data, second color channel data and third color channel data; and
the performing the signal pre-processing on the first image comprises,
performing low pass filtering on the second image to obtain a low pass filtered second image,
calculating the brightness information based on the first color channel data of the first image,
calculating the color information based on the second color channel data and the third color channel data of the low pass filtered second image, and
generating the pre-processed image based on the brightness information and the color information.

7. The method of claim 1, wherein the performing the signal pre-processing on the first image comprises:
receiving information about a white balance gain from an external image signal processor; and
calculating the plurality of threshold values based on the information about the white balance gain, the maximum values of color channel data of the first image, and a normalization factor.

8. The method of claim 1, further comprising:
dilating the detected motion region to obtain a dilated motion region; and
performing in-painting filtering on the dilated motion region in the third image.

9. The method of claim 8, wherein the in-painting filtering is repeatedly performed a number of times.

10. An image device comprising:
an image sensor including,
a plurality of pixels configured to output first analog signals and second analog signals, the first analog signals corresponding to a first exposure time and the second analog signals corresponding to a second exposure time, the second exposure time being shorter than the first exposure time,
an analog-to-digital converter configured to convert the first analog signals and the second analog signals to obtain digital signals including a first image and a second image, and
first processing circuitry configured to,
receive information about a white balance gain from an image signal processor,
generate a pre-processed image by performing pre-processing on the first image based on the information about the white balance gain, and
generate a third image by performing motion compensation based on the pre-processed image; and
the image signal processor including second processing circuitry, the second processing circuitry being configured to perform white balancing on the third image from the image sensor based on the white balance gain to obtain a white balanced image.

11. The image device of claim 10, wherein first processing circuitry is configured to:
separate the first image and the second image from the digital signals;
detect a motion region based on the first image and the second image to obtain a detected motion region;
determine a weight associated with the detected motion region; and
generate the third image based on the weight and the pre-processed image.

12. The image device of claim 11, wherein first processing circuitry is configured to:
compare a magnitude of the first image corresponding to a first region and a magnitude of the second image corresponding to the first region to obtain a comparison result, the first region having a first luminance; and
detect the first region as the detected motion region depending on the comparison result.

13. The image device of claim 11, wherein the first processing circuitry is configured to:
perform low pass filtering on the second image to obtain a low pass filtered second image;
calculate third channel data corresponding to the pre-processed image based on first channel data of the first image and second channel data of the low pass filtered second image; and
generate the pre-processed image based on the third channel data.

14. The image device of claim 13, wherein
the first channel data includes first red channel data, first blue channel data, and first green channel data;
the second channel data includes second red channel data, second blue channel data, and second green channel data;
the third channel data includes third red channel data, third blue channel data, and third green channel data; and
the first processing circuitry is configured to,
calculate the third green channel data based on the first green channel data,
calculate the third red channel data based on the first green channel data, the second red channel data, and the second green channel data, and
calculate the third blue channel data based on the first green channel data, the second blue channel data, and the second green channel data.

15. The image device of claim 11, wherein the first processing circuitry is configured to:
calculate a plurality of threshold values based on the information about the white balance gain and maximum values of first channel data of the first image; and
clip the maximum values of the first channel data of the first image based on the plurality of threshold values to output the pre-processed image.

16. The image device of claim 10, wherein
each of the plurality of pixels includes a plurality of sub-pixels associated with a same color filter;
a first part of the plurality of sub-pixels correspond to the first exposure time; and a second part of the plurality of sub-pixels correspond to the second exposure time, the first part of the plurality of sub-pixels being different from the second part of the plurality of sub-pixels.

17. The image device of claim 10, wherein the second processing circuitry is configured to:
 transform the white balanced image to full-color data to obtain a full-color image;
 correct a color of the full-color image to obtain a color corrected image;
 correct a gamma value of the color corrected image to obtain a gamma corrected image;
 transform the gamma corrected image in correspondence with a particular format to obtain a format transformed image; and
 adjust a sharpness of the format transformed image to obtain a sharpened image.

18. An operation method of an image sensor, the method comprising:
 detecting a motion region based on a first image and a second image to obtain a detected motion region, the first image corresponding to a first exposure time and the second image corresponding to a second exposure time, the second exposure time being shorter than the first exposure time;
 determining a weight for the detected motion region;
 generating a pre-processed image by,
  obtaining information about a white balance gain from an external image signal processor, and
  performing signal pre-processing on the first image based on the information about the white balance gain, the signal pre-processing including,
   using brightness information of the first image and color information of the second image to generate the pre-processed image, or
   clipping maximum values of color channel data of the first image based on a plurality of threshold values to generate the pre-processed image; and
 outputting a third image based on the pre-processed image and the weight.

19. The method of claim 18, wherein the generating the pre-processed image includes:
 calculating the plurality of threshold values based on the information about the white balance gain, the maximum values of color channel data of the first image, and a normalization factor.

20. The method of claim 19, wherein at least one of a maximum value of red channel data of the pre-processed image and a maximum value of blue channel data of the pre-processed image is smaller than a maximum value of green channel data of the pre-processed image.

* * * * *